(12) United States Patent
Chung et al.

(10) Patent No.: US 10,720,537 B2
(45) Date of Patent: Jul. 21, 2020

(54) SOLAR CELL

(71) Applicant: LG ELECTRONICS INC., Seoul (KR)

(72) Inventors: Indo Chung, Seoul (KR); Seunghwan Shim, Seoul (KR); Ilhyoung Jung, Seoul (KR); Jeongbeom Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/222,496

(22) Filed: Dec. 17, 2018

(65) Prior Publication Data
US 2019/0115484 A1 Apr. 18, 2019

Related U.S. Application Data

(62) Division of application No. 14/659,053, filed on Mar. 16, 2015, now Pat. No. 10,181,534.

(30) Foreign Application Priority Data

Mar. 17, 2014 (KR) .................. 10-2014-0031204

(51) Int. Cl.
*H01L 31/0224* (2006.01)
*H01L 31/0747* (2012.01)
(Continued)

(52) U.S. Cl.
CPC ............ *H01L 31/022433* (2013.01); *H01L 31/02167* (2013.01); *H01L 31/02168* (2013.01);
(Continued)

(58) Field of Classification Search
CPC ....... H01L 31/022433; H01L 31/02167; H01L 31/02168; H01L 31/022441; H01L 31/0747; H01L 31/0682
See application file for complete search history.

(56) References Cited

U.S. PATENT DOCUMENTS 5,538,564 A * 7/1996 Kaschmitter ..... H01L 31/03529
136/255
5,641,362 A * 6/1997 Meier ............. H01L 31/022441
136/256
(Continued)

FOREIGN PATENT DOCUMENTS

CN 101771097 A 7/2010
CN 102239565 A 11/2011
(Continued)

OTHER PUBLICATIONS

"Silicon carbide (SiC), refractive index, absorption coefficient, optical spectra", accessed from https://link.springer.com/chapter/10.1007%2E10932182_605, accessed on Sep. 5, 2017.
(Continued)

*Primary Examiner* — Golam Mowla
(74) *Attorney, Agent, or Firm* — Birch, Stewart, Kolasch & Birch, LLP

(57) ABSTRACT

Discussed is a solar cell includes a semiconductor substrate, a conductive type region including a first conductive type region and a second conductive type region formed on one surface of the semiconductor substrate, an electrode including a first electrode and a second electrode, wherein the first electrode is connected to the first conductive type region and the second electrode is connected to the second conductive type region, and a passivation layer formed on the conductive type region. The passivation layer includes at least one of silicon nitride and silicon carbide.

10 Claims, 11 Drawing Sheets

(51) Int. Cl.
*H01L 31/0216* (2014.01)
*H01L 31/068* (2012.01)
*H01L 31/18* (2006.01)

(52) U.S. Cl.
CPC .. *H01L 31/022441* (2013.01); *H01L 31/0682* (2013.01); *H01L 31/0747* (2013.01); *H01L 31/1804* (2013.01); *H01L 31/1868* (2013.01); *Y02E 10/547* (2013.01); *Y02P 70/521* (2015.11)

(56) References Cited

U.S. PATENT DOCUMENTS

| | | | | |
|---|---|---|---|---|
| 7,339,110 | B1* | 3/2008 | Mulligan | H01L 31/022441 136/256 |
| 7,897,867 | B1* | 3/2011 | Mulligan | H01L 31/022441 136/252 |
| 8,535,970 | B2* | 9/2013 | Krauser | H01L 31/02167 257/E21.114 |
| 9,312,405 | B2* | 4/2016 | Lee | H01L 31/022441 |
| 9,991,401 | B2* | 6/2018 | Kim | H01L 31/022425 |
| 2002/0119250 | A1* | 8/2002 | Campana | C23C 16/36 427/255.28 |
| 2006/0060238 | A1 | 3/2006 | Hacke et al. | |
| 2006/0157733 | A1* | 7/2006 | Lucovsky | H01L 21/28194 257/192 |
| 2007/0256728 | A1* | 11/2007 | Cousins | H01L 31/0745 136/252 |
| 2009/0095346 | A1* | 4/2009 | Hurley | C23C 16/30 136/256 |
| 2009/0239331 | A1* | 9/2009 | Xu | H01L 31/022425 438/98 |
| 2009/0317934 | A1 | 12/2009 | Scherff et al. | |
| 2010/0032011 | A1* | 2/2010 | Sauar | H01L 31/02167 136/256 |
| 2010/0055822 | A1* | 3/2010 | Weidman | G01T 1/2018 438/57 |
| 2010/0055901 | A1* | 3/2010 | Zhang | B23K 26/03 438/669 |
| 2010/0263725 | A1* | 10/2010 | Schmidt | C23C 16/403 136/261 |
| 2011/0237016 | A1 | 9/2011 | Nishimoto | |
| 2011/0265866 | A1* | 11/2011 | Oh | H01L 31/02167 136/255 |
| 2012/0024368 | A1* | 2/2012 | Sauar | H01L 31/1864 136/256 |
| 2012/0060912 | A1* | 3/2012 | Cho | H01L 31/022441 136/256 |
| 2012/0073650 | A1 | 3/2012 | Smith et al. | |
| 2012/0145233 | A1* | 6/2012 | Syn | H01L 31/02167 136/256 |
| 2012/0152598 | A1* | 6/2012 | Yamada | B23K 1/0016 174/257 |
| 2012/0247560 | A1* | 10/2012 | Rim | H01L 21/02381 136/261 |
| 2012/0291860 | A1 | 11/2012 | Park et al. | |
| 2012/0325309 | A1* | 12/2012 | Takahama | H01L 31/022441 136/256 |
| 2013/0112253 | A1* | 5/2013 | Oh | H01L 31/03529 136/255 |
| 2013/0133729 | A1* | 5/2013 | Mo | H01L 31/022441 136/255 |
| 2013/0175648 | A1* | 7/2013 | Kim | H01L 31/1804 257/432 |
| 2013/0267046 | A1* | 10/2013 | Or-Bach | H01L 27/088 438/14 |
| 2014/0373896 | A1* | 12/2014 | Matsuura | H01L 31/0682 136/244 |
| 2015/0027522 | A1* | 1/2015 | Mueller | H01L 31/02363 136/256 |
| 2015/0129037 | A1* | 5/2015 | Nam | H01L 31/022441 136/259 |
| 2018/0083149 | A1* | 3/2018 | Kim | H01L 31/0747 |

FOREIGN PATENT DOCUMENTS

| | | |
|---|---|---|
| CN | 103227247 A | 7/2013 |
| CN | 203179930 U | 9/2013 |
| CN | 103346211 A | 10/2013 |
| EP | 2871682 A1 | 5/2015 |
| GB | 2467361 A | 8/2010 |
| JP | 2008-311291 A | 12/2008 |
| JP | 2010-503222 A | 1/2010 |
| JP | 2013-538009 A | 10/2013 |
| KR | 10-2009-0085136 A | 8/2009 |
| KR | 10-2012-0026813 A | 3/2012 |
| KR | 10-2012-0129264 A | 11/2012 |
| KR | 10-2013-0066410 A | 6/2013 |
| KR | 10-2013-0138285 A | 12/2013 |
| KR | 10-2013-0140106 A | 12/2013 |
| WO | WO 2012/053079 A1 | 4/2012 |
| WO | WO 2015/044070 A1 | 4/2015 |

OTHER PUBLICATIONS

Blech et al., "Detailed Study of PECVD Silicon Nitride and Correlation of Various Characterization Techniques," Proceedings of the 24th European Photovoltaic Solar Energy Conference and Exhibition, Hamburg, Germany, XP055125322, Sep. 21, 2009, 5 pages.

Shu et al., "Low Temperature Front Surface Passivation of Interdigitated Back Contact Silicon Heterojunction Solar Cell," Photovoltaic Specialists Conference (PVSC), 34th IEEE, Piscataway, USA, Jun. 7, 2009, pp. 001316-001320.

* cited by examiner (a)

(b)

(c)

SOLAR CELL

CROSS-REFERENCE TO RELATED APPLICATION

This application is a Divisional of U.S. patent application Ser. No. 14/659,053, filed on Mar. 16, 2015, which claims the priority benefit of Korean Patent Application No. 10-2014-0031204, filed on Mar. 17, 2014 in the Korean Intellectual Property Office, all of which are hereby incorporated by reference into the present application.

BACKGROUND OF THE INVENTION

1. Field of the Invention

The invention relates to a solar cell and, more particularly, to a solar cell having an improved structure.

2. Description of the Related Art

In recent years, as conventional energy resources such as petroleum and coal are running out, interest in alternative energy resources replacing these energy resources is on the rise. Of these, solar cells are attracting considerable attention as next generation cells which convert solar energy into electrical energy.

Such a solar cell is manufactured by forming various layers and electrodes according to design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

The embodiment of the invention is for providing a solar cell with improved efficiency.

A solar cell according to embodiments of the invention includes a semiconductor substrate, a conductive type region including a first conductive type region and a second conductive type region formed on one surface of the semiconductor substrate, an electrode including a first electrode and a second electrode, wherein the first electrode is connected to the first conductive type region and the second electrode is connected to the second conductive type region, and a passivation layer formed on the conductive type region. The passivation layer includes at least one of silicon nitride and silicon carbide.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF THE EMBODIMENTS

Figure 1:
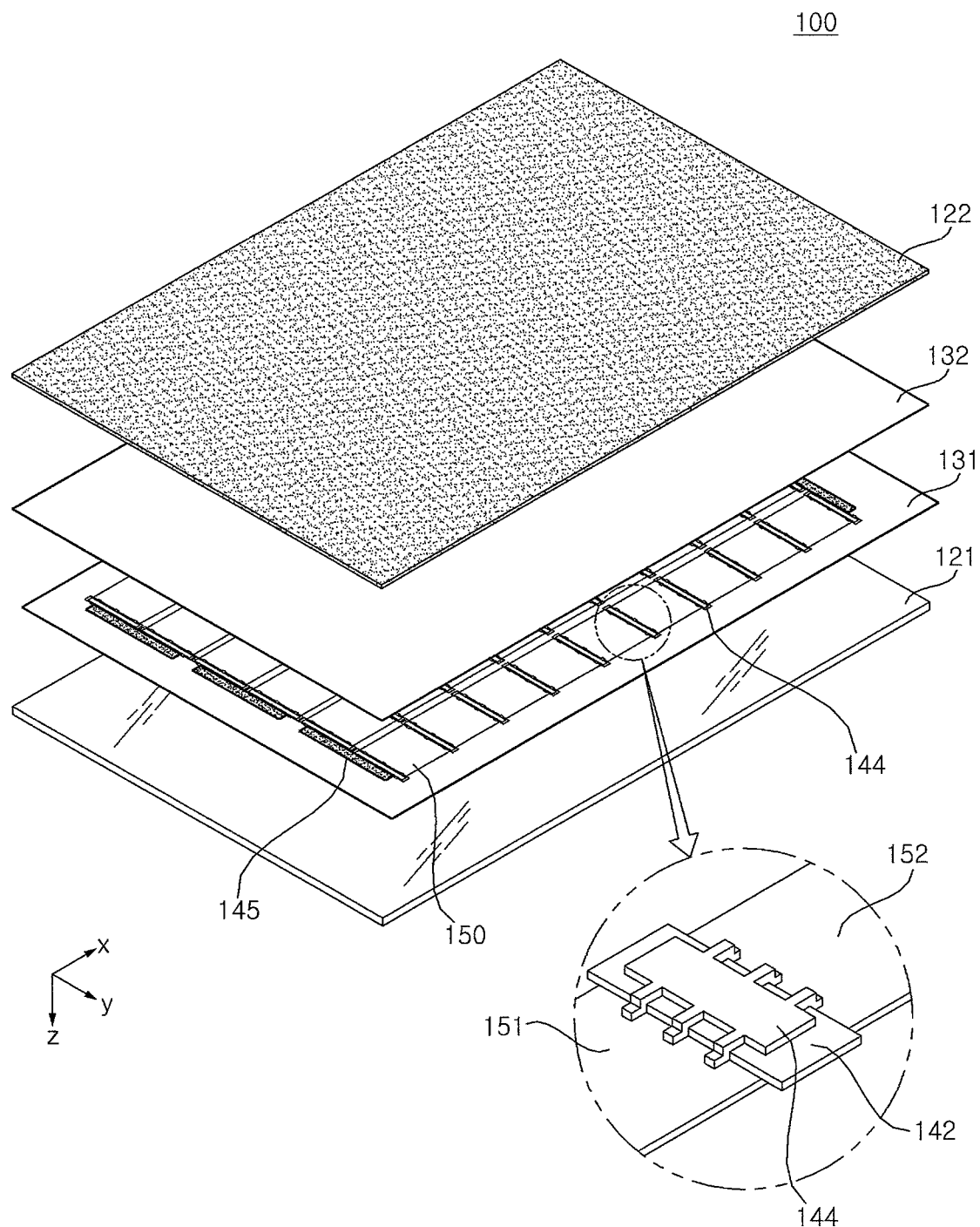
FIG. 1 is a rear perspective view of a solar cell module according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Only elements constituting features of the invention are illustrated in the accompanying drawings and other elements that will not be described herein are omitted from the drawings, for clarity of description. Like reference numerals refer to like elements throughout. In the drawings, the thicknesses, areas, etc., of constituent elements may be exaggerated or reduced for clarity and convenience of illustration. The invention is not limited to the illustrated thicknesses, areas, etc.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a region or a plate is referred to as being "on" another element, the one element may be directly on the another element, and one or more intervening elements may also be present. In contrast, when one element such as a layer, a region or a plate is referred to as being "directly on" another element, one or more intervening elements are not present.

Hereinafter, solar cells and an electrode used for the same according to embodiments of the invention will be described in detail with reference to the accompanying drawings. First, a solar cell module will be described in detail and thereafter solar cells included therein and electrodes used in the solar cells will be described in detail.

FIG. 1 is a rear perspective view of a solar cell module 100 according to an embodiment of the invention.

Referring to FIG. 1, the solar cell module 100 according to an embodiment of the invention includes at least one solar cell (for example, solar cells) 150, a first substrate 121 (hereinafter referred to as "front substrate") disposed on front surfaces of the solar cells 150, and a second substrate 122 (hereinafter referred to as "back sheet") disposed on back surfaces of the solar cells 150. In addition, the solar cell module 100 may include a first sealant 131 disposed between the solar cells 150 and the front substrate 121 and a second sealant 132 disposed between the solar cells 150 and the back sheet 122. This will be described below in more detail.

First, each solar cell 150 is configured to include a photoelectric conversion unit to convert solar energy into electric energy and an electrode electrically connected to the photoelectric conversion unit. In the embodiment of the invention, the photoelectric conversion unit may, for example, be a photoelectric conversion unit including a semiconductor substrate (e.g., a silicon wafer) or a semiconductor layer (e.g., a silicon layer). The solar cell 150 having the structure described above will be described below in detail with reference to FIGS. 2 and 3.

The solar cell 150 includes a ribbon or ribbons 144. The solar cells 150 may be electrically connected to each other by the ribbons 144 in series, in parallel, or in series-parallel. Adjacent first and second solar cells 151 and 152 will be described by way of example. That is, the ribbon 144 may connect a first electrode 42 (see FIGS. 2 and 3) of the first solar cell 151 to a second electrode 44 (see FIGS. 2 and 3) of the second solar cell 152 adjacent to the first solar cell 151. A connection structure among the ribbon 144, the first electrode 42 of the first solar cell 151, and the second electrode 44 of the second solar cell 152 may be variously changed. For example, the first electrodes 42 of the first and second solar cells 151 and 152 may be connected to each other along a first edge, and the second electrodes 44 of the first and second solar cells 151 and 152 may be connected to each other along a second edge opposite the first edge. In this regard, the ribbon 144 may be formed across the first and second solar cells 151 and 152 so as to connect the first electrode 42 disposed at the first edge of the first solar cell 151 and the second electrode 44 disposed at the second edge of the second solar cell 152 adjacent to the first solar cell 151 and may extend along the first and second edges. In this regard, to prevent unnecessary short circuit between the ribbon 144 and the first and second solar cells 151 and 152, an insulating layer 142 is partially disposed between the ribbon 144 and the first and second solar cells 151 and 152, and a protrusion of the ribbon 144 protruding beyond the insulating layer 142 may be connected to the first or second electrode 42 or 44. However, the embodiments of the invention are not limited to the above examples and various modifications are possible.

In addition, a bus ribbon 145 alternately connects opposite ends of the ribbons 144 of the solar cells 150 connected by the ribbons 144 and arranged in a single row. The bus ribbon 145 may be arranged in a direction crossing end portions of the solar cells 150 arranged in a single row. The bus ribbon 145 may be connected to a junction box that collects electricity generated by the solar cells 150 and prevents reverse flow of electricity.

The first sealant 131 may be disposed on the front surface of the solar cells 150, and the second sealant 132 may be disposed on the back surface of the solar cells 150. The first sealant 131 and the second sealant 132 are adhered to each other by lamination and thus prevent permeation of moisture or oxygen that may adversely affect the solar cells 150 and enable chemical bonding of the elements of the solar cells 150.

The first sealant 131 and the second sealant 132 may be ethylene vinyl acetate (EVA) copolymer resin, polyvinyl butyral, a silicon resin, an ester-based resin, an olefin-based resin, or the like, but the embodiment of the invention is not limited thereto. Thus, the first and second sealants 131 and 132 may be formed using various other materials by various methods other than lamination.

The front substrate 121 is disposed on the first sealant 131 so as to pass sunlight therethrough and may be made of tempered glass to protect the solar cells 150 from external impact and the like. In addition, the front substrate 121 may be made of low-iron tempered glass to prevent reflection of sunlight and increase transmittance of sunlight, but the embodiment of the invention is not limited thereto. That is, the front substrate 121 may be made of various other materials.

The back sheet 122 is disposed on the other surfaces of the solar cells 150 to protect the solar cells 150 and is waterproof and insulating and blocks ultraviolet light. The back sheet 122 may be made of a layer, a sheet, or the like. The back sheet 122 may be of a Tedlar/PET/Tedlar (TPT) type or may be a structure in which polyvinylidene fluoride (PVDF) resin or the like is formed on at least one surface of polyethylene terephthalate (PET). PVDF, which is a polymer having a structure of $(CH_2CF_2)_n$, has a double fluorine molecular structure and thus has excellent mechanical properties, weather resistance and UV resistance, but the embodiment of the invention is not limited thereto. That is, the back sheet 122 may be made of various other materials. In this regard, the back sheet 122 may be made of a material with excellent reflectance so as to reflect sunlight incident from the front substrate 121 and for the sunlight to be reused, but the embodiment of the invention is not limited thereto. That is, the back sheet 122 may be made of a transparent material (e.g., glass) so that sunlight is incident therethrough and thus the solar cell module 100 may be embodied as a double-sided light receiving solar cell module.

The structure of the above-described solar cell 150 will now be described in detail with reference to FIGS. 2 and 3.

Figure 2:
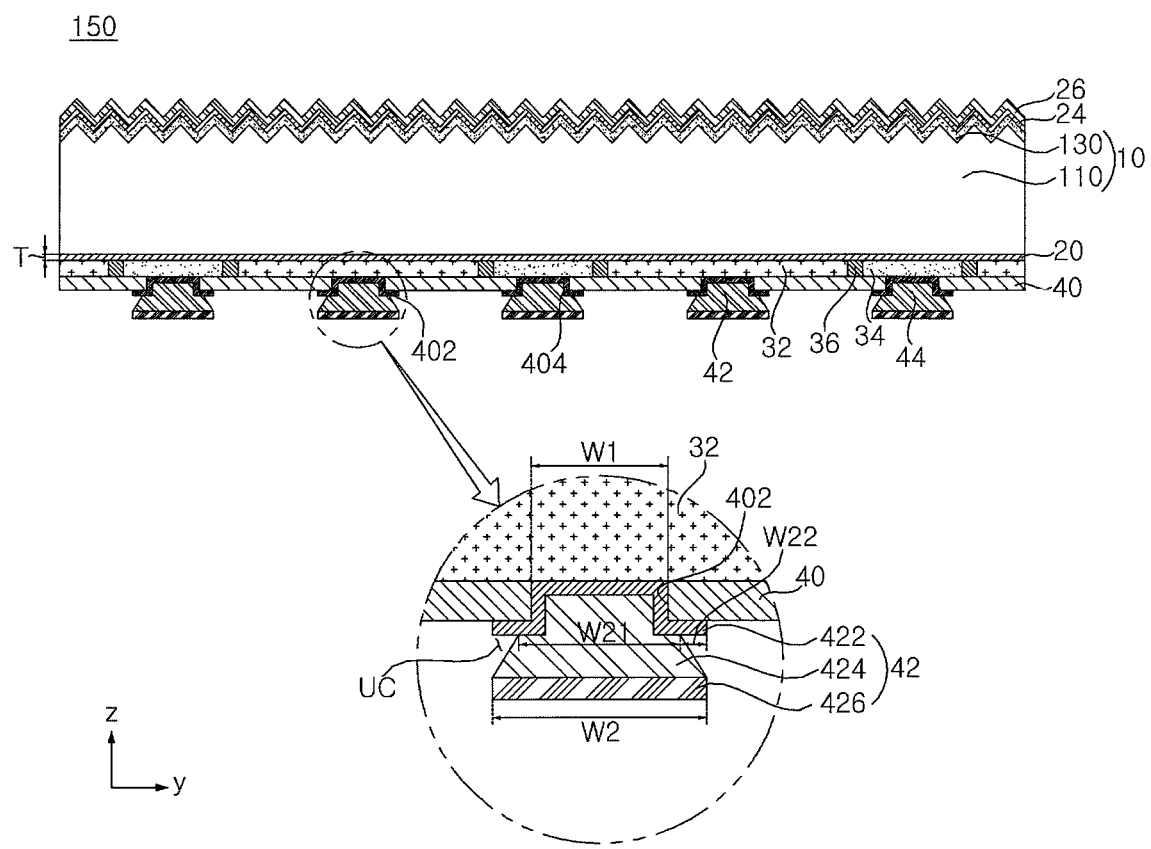
FIG. 2 is a sectional view of a solar cell according to the embodiment of the invention.
Figure 3:
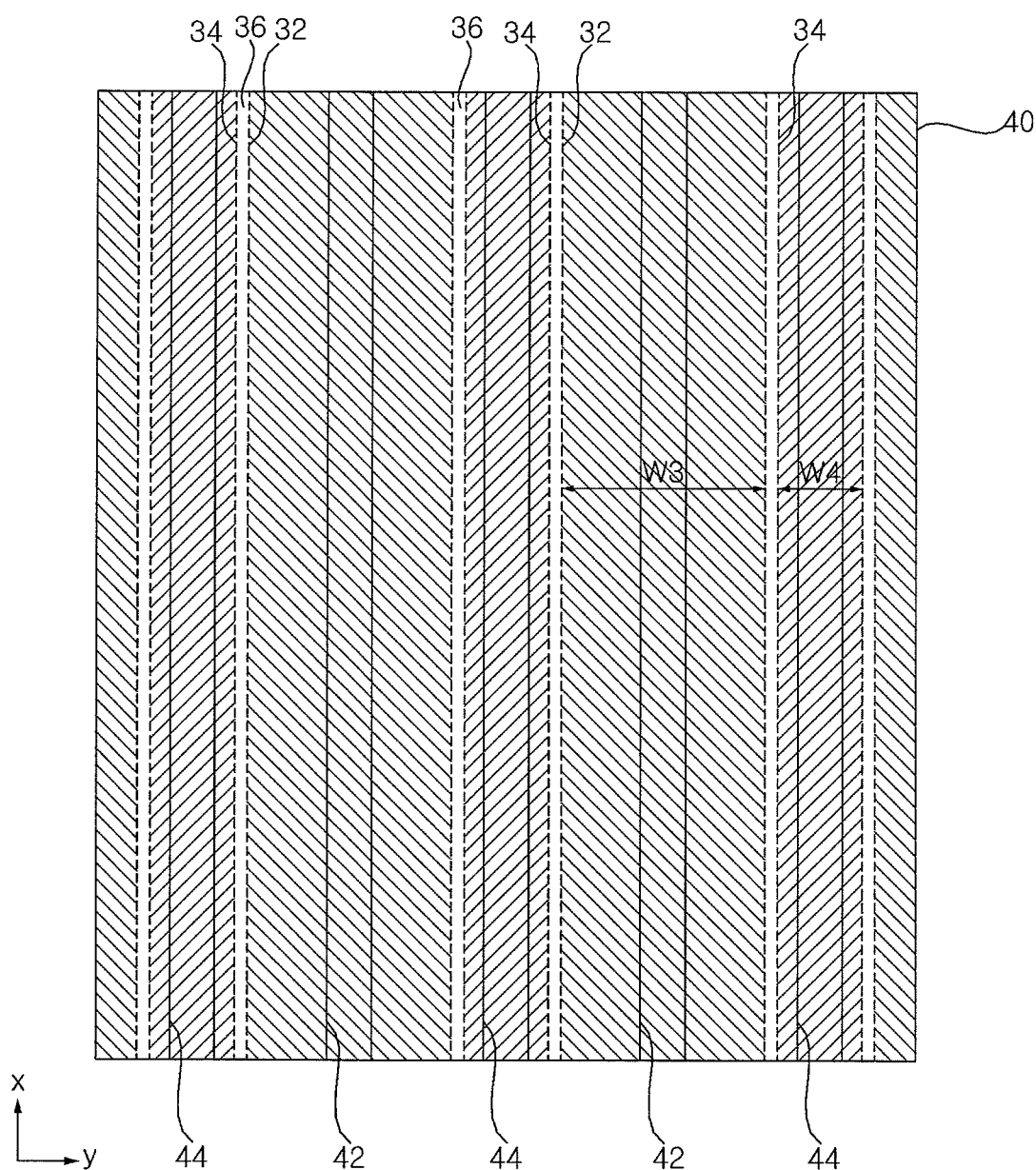
FIG. 3 is a partial rear plan view of the solar cell illustrated in FIG. 2.

FIG. 2 is a sectional view of the solar cell 150 according to the embodiment of the invention, and FIG. 3 is a partial rear plan view of the solar cell 150 of FIG. 2.

Referring to FIGS. 2 and 3, the solar cell 150 according to the embodiment of the invention includes a semiconductor substrate 10 including a base region 110, a tunneling layer 20 on one surface of the semiconductor substrate 10 (for example, a back surface of the semiconductor substrate 10), a conductive type region 32 or 34 (or conductive type regions 32 and 34) on the tunneling layer 20, an electrode 42 or 44 (or electrodes 42 and 44) connected to one of the conductive type regions 32 and 34. The solar cell 150 may further include a passivation layer 24, an anti-reflective layer 25, a passivation layer (or a back passivation layer) 40 and the like. This will be described in more detail.

The semiconductor substrate 10 may include the base region 110 including the second conductive type dopant (of dopants) at a relatively low doping concentration. The base region 110 may include crystalline (single-crystalline or polycrystalline) silicon including the second conductive type dopant. For example, the base region 110 may be a single-crystalline silicon substrate including the second conductive type dopant. The second conductive type dopant may be of an n-type or a p-type. When the first conductive type dopant is of an n-type, the first conductive type dopant may be a Group V element such as P, As, Bi, Sb, or the like. When the first conductive type dopant is of a p-type, the first conductive type dopant may be a Group III element such as B, Al, Ga, In, or the like.

For example, when the base region 110 is of an n-type, the first conductive type region 32 of a p-type to form a junction (e.g., a pn junction with the tunneling layer 20 disposed therebetween) that forms carriers by photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (single-crystalline or polycrystalline) semiconductor of the second conductive type. For example, the front surface field region 130 may be formed as a portion of a single-crystalline semiconductor substrate (e.g., a single-crystalline silicon wafer substrate) of a second conductive type. However, the embodiment of the invention is not limited to the above examples. Thus, the front surface field region 130 may be formed by doping a separate semiconductor layer from the semiconductor substrate 10 (e.g., an amorphous semiconductor layer, a micro-crystalline semiconductor layer, or a polycrystalline semiconductor layer) with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cell 150 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 150 may be enhanced. However, the embodiment of the invention is not limited to the above example. In some instances, an uneven portion may be formed at the back surface of the semiconductor substrate 10 by texturing. In addition, various modifications are possible.

The tunneling layer 20 is formed on the back surface of the semiconductor substrate 10. Interface properties of the back surface of the semiconductor substrate 10 may be enhanced by the tunneling layer 20 and the tunneling layer 20 enables carriers generated by photoelectric conversion to be smoothly transferred by tunneling effects. The tunneling layer 20 may include various materials enabling carriers to tunnel therethrough, e.g., an oxide, a nitride, a semiconductor, a conductive polymer, or the like. For example, the tunneling layer 20 may include a silicon oxide, a silicon nitride, a silicon oxynitride, an intrinsic amorphous silicon, an intrinsic polycrystalline silicon, or the like. In this regard, the tunneling layer 20 may be formed over the entire back surface of the semiconductor substrate 10. Accordingly, the tunneling layer 20 may entirely enhance the property of the back surface of the semiconductor substrate 10 and be easily formed without separate patterning.

To have sufficient tunneling effects, the tunneling layer 20 may have a thickness T that is smaller than that of a passivation layer 40. For example, the thickness T of the tunneling layer 20 may be 10 nm or less, for example, 0.5 nm to 10 nm (more particularly, 0.5 nm to 5 nm, e.g., 1 nm to 4 nm). When the thickness T of the tunneling layer 20 exceeds 10 nm, tunneling does not smoothly occur and thus the solar cell 150 may not operate. On the other hand, when the thickness T of the tunneling layer 20 is less than 0.5 nm, it may be difficult to form the tunneling layer 20 with desired quality. To further improve the tunneling effects, the thickness T of the tunneling layer 20 may be 0.5 nm to 5 nm (more particularly, 1 nm to 4 nm). However, the embodiment of the invention is not limited to the above examples and the thickness T of the tunneling layer 20 may have various values.

The conductive type regions 32 and 34 may be disposed on the tunneling layer 20. More particularly, the conductive type regions 32 and 34 may include the first conductive type region 32 including the first conductive type dopant thus having the first conductive type and the second conductive type region 34 including the second conductive type dopant thus having the second conductive type. In addition, a barrier region 36 may be disposed between the first and second conductive type regions 32 and 34.

The first conductive type region 32 forms a pn junction (or pn tunnel junction) with the base region 110 while disposing the tunneling layer 20 therebetween and thus constitutes an emitter region that generates carriers by photoelectric conversion.

In this regard, the first conductive type region 32 may include a semiconductor (e.g., silicon) including the first conductive type dopant opposite the base region 110. In the embodiment of the invention, the first conductive type region 32 is formed separately from the semiconductor substrate 10, on the semiconductor substrate 10 (more particularly, on the tunneling layer 20). The first conductive type region 32 may be formed as a semiconductor layer doped with the first conductive type dopant. Thus, the first conductive type region 32 may be formed as a semiconductor layer having a different crystal structure than the semiconductor substrate 10 so as to be easily formed on the semiconductor substrate 10. For example, the first conductive type region 32 may be formed by doping an amorphous semiconductor, micro-crystalline semiconductor or poly-crystalline semiconductor (e.g., amorphous silicon, micro-crystalline silicon, or polycrystalline silicon) that may be easily manufactured by various methods such as deposition and the like, with a first conductive type dopant. The first conductive type dopant may be included in the semiconductor layer when forming the semiconductor layer or may be included in the semiconductor layer by various doping methods such as thermal diffusion, ion implantation, and the like after forming the semiconductor layer.

In this regard, the first conductive type dopant may be any dopant having a conductive type opposite the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34 forms a back surface field and thus forms a back surface field region that prevents loss of carriers by recombination at a surface (more particularly, the back surface) of the semiconductor substrate 10.

In this regard, the second conductive type region 34 may include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20). The second conductive type region 34 is formed as a semiconductor layer doped with a second conductive type dopant. Thus, the second conductive type region 34 may be formed as a semiconductor layer having a different crystal structure than the semiconductor substrate 10 so as to be easily formed on the semiconductor substrate 10. For example, the second conductive type region 34 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a second conductive type dopant. The second conductive type dopant may be included in the semiconductor layer when forming the semiconductor layer or may be included in the semiconductor layer by various doping methods such as thermal diffusion, ion implantation, and the like after forming the semiconductor layer.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and 34 contact each other, shunting may occur and, accordingly, performance of the solar cell 150 may be deteriorated. Thus, in the embodiment of the invention, the barrier region 36 may be disposed between the first and second conductive type regions 32 and 34 to prevent unnecessary occurrence of shunting.

The barrier region 36 may include various materials enabling the first and second conductive type regions 32 and 34 to be substantially insulated from each other. That is, the barrier region 36 may be formed of an undoped insulating material (e.g., an oxide or a nitride). In another embodiment of the invention, the barrier region 36 may include an intrinsic semiconductor. In this regard, the first and second conductive type regions 32 and 34 and the barrier region 36 are formed on the same plane, have substantially the same thickness, are formed of the same semiconductor (e.g., amorphous silicon, micro-crystalline silicon, or polycrystalline silicon), and may not include a dopant. For example, a semiconductor layer including a semiconductor material may be formed, a region of the semiconductor layer is doped with a first conductive type dopant to form the first conductive type region 32, another region thereof is doped with a second conductive type dopant to form the second conductive type region 34, and the barrier region 36 may be formed in a region of the semiconductor layer in which the first and second conductive type regions 32 and 34 are not formed. According to the embodiment of the invention, a manufacturing method of the first and second conductive type regions 32 and 34 and the barrier region 36 may be simplified.

However, the embodiment of the invention is not limited to the above examples. That is, when the barrier region 36 is formed separately from the first and second conductive type regions 32 and 34, the barrier region 36 may have a different thickness than that of the first and second conductive type regions 32 and 34. For example, to more effectively prevent short circuit between the first and second conductive type regions 32 and 34, the thickness of the barrier region 36 may be greater than that of the first and second conductive type regions 32 and 34. In another embodiment of the invention, to reduce raw material costs for forming the barrier region 36, the thickness of the barrier region 36 may be less than that of the first and second conductive type regions 32 and 34. In addition, various modifications are possible. In addition, a base material of the barrier region 36 may be different than those of the first and second conductive type regions 32 and 34. In another embodiment of the invention, the barrier region 36 may be formed as an empty space (e.g., a trench) disposed between the first and second conductive type regions 32 and 34.

In addition, the barrier region 36 may be formed so as to partially separate the first and second conductive type regions 32 and 34 at an interface therebetween from each other. Thus, some portion of the interface between the first and second conductive type regions 32 and 34 may be separated from each other, while the other portion of the interface between the first and second conductive type regions 32 and 34 may contact each other. In addition, the barrier region 36 may not be necessarily formed, and the first and second conductive type regions 32 and 34 may entirely contact each other. In addition, various modifications are possible.

In this regard, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are n-type conductive and the first conductive type region 32 is p-type conductive, the first conductive type region 32 having a wide area may effectively collect holes having a relatively slow movement rate. The planar structure of the first and second conductive type regions 32 and 34 and the barrier region 36 will be described below in further detail with reference to FIG. 3.

In the embodiment of the invention, an instance in which the first and second conductive type regions 32 and 34 are disposed on the back surface of the semiconductor substrate 10 with the tunneling layer 20 disposed therebetween has been described by way of example. However, the embodiment of the invention is not limited to the above example. In another embodiment of the invention, the tunneling layer 20 need not be formed and the first and second conductive type regions 32 and 34 may be formed as doping regions formed by doping the semiconductor substrate 10 with a dopant. That is, the first and second conductive type regions 32 and 34 may be formed as doping regions having a single-crystalline semiconductor structure constituting a portion of the semiconductor substrate 10. This will be described later with reference to FIG. 8. The first and second conductive type regions 32 and 34 may be formed using various other methods.

A passivation layer 40 may be formed on the first and second conductive type regions 32 and 34 and the barrier region 36, and may include one or more of a first layer 40a and a second layer 40b. The passivation layer 40 may prevent electrodes to which the first and second conductive type regions 32 and 34 must not be connected (i.e., the second electrode 44 for the first conductive type region 32 and the first electrode 42 for the second conductive type region 34) from being connected to each other and may passivate the first and second conductive type regions 32 and 34. The passivation layer 40 includes first openings 402 for exposing the first conductive type region 32 and second openings 404 for exposing the second conductive type region 34.

In the embodiment of the invention, the passivation layer 40 may include a material having enhanced durability, acid resistance, property for preventing metal diffusion, and plasma resistance in order to prevent a damage of the passivation layer 40, the conductive type regions 32 and 34, and/or the semiconductor substrate 10 that may be induced when the electrodes 42 and 44 are formed. In the embodiment of the invention, since the first electrode 42 and the second electrode 44 are formed on the back surface of the semiconductor substrate 10, possibility of the damage of the passivation layer 40, the conductive type regions 32 and 34, and/or the semiconductor substrate 10 may increase when the electrodes 42 and 44 are formed by various processes (a deposition process, an etching process, and so on). Thus, because a silicon oxide used for the conventional passivation layer has bad durability, acid resistance, property for preventing metal diffusion, and plasma resistance, the conventional passivation layer and so one may be damaged by an etching solution, or plasma or a metal of the electrodes 42 and 44 may penetrate the passivation layer and diffuse into the conductive type regions 32 and 34 when the electrodes 42 and 44 are formed.

Accordingly, in the embodiment of the invention, the passivation layer 40 includes at least one of a silicon nitride and a silicon carbide.

For example, in the embodiment of the invention, the passivation layer 40 may include a single layer of a silicon nitride layer including the silicon nitride and has a refractive index of about 2.1 or more (for example, about 2.1 to about 2.2). When the passivation layer 40 includes the silicon nitride, the passivation layer 40 has a superior insulating property and an enhanced passivation property. In the passivation layer 40 including the silicon nitride, the refractive index is proportional to a density of the passivation layer 40. Thus, the fact that the refractive index of the passivation layer 40 is high means that the density of the passivation layer 40 is high. Accordingly, the passivation layer 40 including the silicon nitride having high refractive index can be prevented from the chemical damage. Therefore, when the passivation layer 40 including the silicon nitride has the refractive index of about 2.1 or more, the damage due to the plasma used during a sputtering process for depositing the electrodes 42 and 44, the chemical damage of the passivation layer 40 that may be induced during an etching process for patterning of the electrodes 42 and 44, and the diffusion of metal included in the electrodes 42 and 44 can be effectively prevented. Accordingly, a current density and an open circuit voltage of the solar cell 150 can be enhanced. In this instance, the refractive index of the passivation layer 40 is larger than about 2.2, the passivation property of the passivation layer 40 can be deteriorated.

As another example, in the embodiment of the invention, the passivation layer 40 includes a single layer of a silicon carbide layer including the silicon carbide. In this instance, the silicon carbide has an amorphous structure, and thus, has a superior insulating property. Also, the silicon carbide has a hydrophobic property, and thus, has a superior acid resistance. Generally, the etching by using an acid material is accelerated at a hydrophilic layer. Therefore, in the passivation layer 40 including the hydrophobic silicon carbide as in the embodiment of the invention, the etching due to the acid material can be effectively prevented. Therefore, the chemical damage of the passivation layer 40 that may be induced during the etching process by using the etching solution in order to patterning the electrodes 42 and 44 can be effectively prevented. Accordingly, a current density and an open circuit voltage of the solar cell 150 can be enhanced.

When the passivation layer 40 includes the silicon carbide layer, the silicon carbide layer may have a refractive index of about 1.5 to 2.0. Within the range, reflection property at the back surface can be enhanced in the solar cell 150 having a back contact structure where the electrodes 42 and 44 are positioned on the back surface of the semiconductor substrate 10. However, the embodiment of the invention is not limited thereto, and thus, the passivation layer 40 may have the refractive index different from the above.

The passivation layer 40 may have a thickness the same as or larger than that of the tunneling layer 20. Then, the insulating property and the passivation property of the passivation layer 40 can be enhanced, and the chemical damage, the plasma damage, and the metal diffusion of the passivation layer 40 can be prevented. For example, when the passivation layer 40 has the single layer of the silicon nitride layer or the silicon carbide layer, the passivation layer 40 has a thickness of about 50 nm to about 200 nm. When the passivation layer 40 is smaller than about 50 nm, the effect of the passivation layer 40 may be not sufficient. When the passivation layer 40 is larger than 200 nm, the openings 402 and 404 may be not stably formed because of the large thickness of the passivation layer 40. However, the embodiment of the invention is not limited thereto, and thus, the passivation layer 40 may be varied.

When the passivation layer 40 is formed of the single layer as in the embodiment of the invention, a structure of the passivation layer 40 can be simplified and a manufacturing method can be also simplified. However, the embodiment of the invention is not limited thereto, and thus, the passivation layer 40 may include another layer other than the silicon nitride layer or the silicon carbide layer.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In the embodiment of the invention, the first electrode 42 is connected to the first conductive type region 32 through penetrating of the first opening 402 of the passivation layer 40. The second electrode 44 is connected to the second conductive type region 34 through penetrating of the second opening 404 of the passivation layer 40. The first and second electrodes 42 and 44 may include various metal materials. In addition, the first and second electrodes 42 and 44 are not electrically connected to each other but are respectively connected to the first conductive type region 32 and the second conductive type region 34, and may have various planar shapes enabling collection of carriers generated and transfer of the collected carriers to the outside. However, the shapes of the first and second electrodes 42 and 44 are not limited to the above example.

Hereinafter, a stacked structure of the first electrode 42 and/or the second electrode 44 will be described in detail with reference to an enlarged circle of FIG. 2, and the planar structure of the first electrode 42 and/or the second electrode 44 will be described in detail with reference to FIG. 3. The first electrode 42 will be described below with reference to the enlarged circle of FIG. 2 by way of example, but the second electrode 44 may also have the same or similar structure as that of the first electrode 42. That is, the stacked structure of the first electrode 42 may also be applied to the second electrode 44.

Referring to the enlarged circle of FIG. 2, the first electrode 42 may include an adhesive layer 422, an electrode layer 424 formed on the adhesive layer 422, a ribbon-connected layer 426 formed on or with the electrode layer 424. The adhesive layer 422 contacts the semiconductor layer for the first conductive type region 32 (the second conductive type region 34 in the instance of the second electrode 44) and may be transparent and conductive. In this regard, the electrode layer 424 basically acts as an electrode that collects carriers generated by photoelectric conversion and transfers the collected carriers to the outside, and the adhesive layer 422 may enhance contact property and adhesion property of the first conductive type region 32 and the electrode layer 424. The ribbon-connected layer 426 is a layer where the ribbon 144 is connected (for example, the ribbon 144 is in contact).

The adhesive layer 422 may be formed between the semiconductor layer and the electrode layer 424 in contact therewith. The adhesive layer 422 has conductivity and may include a metal having excellent contact characteristics with the semiconductor layer. Accordingly, conductivity of the first electrode 42 need not be reduced and adhesion between the semiconductor layer and the electrode layer 424 may be enhanced. To enhance contact characteristics with the semiconductor layer, the adhesive layer 422 may have a coefficient of thermal expansion between a coefficient of thermal expansion of the semiconductor layer and a coefficient of thermal expansion of a portion of the electrode layer 424 adjacent to the adhesive layer 422.

More particularly, when a difference between the coefficients of thermal expansion of the semiconductor layer and the first electrode 42 is large, interfacial contact between the semiconductor layer and the first electrode 42 may be deteriorated when various heat treatment processes for forming the solar cell 150 are performed. Accordingly, a contact resistance between the semiconductor layer and the first electrode 42 may be increased. This may be more problematic when a contact area between a line width of the semiconductor layer or the first electrode 42 is small and a contact area between the semiconductor layer and the first electrode 42 is small. Thus, in the embodiment of the invention, a coefficient of thermal expansion difference between the semiconductor layer and the first electrode 42 is reduced by restricting a coefficient of thermal expansion of the adhesive layer 422 of the first electrode 42 adjacent to semiconductor layer, which results in enhanced interfacial contact characteristics.

The semiconductor layer has a coefficient of thermal expansion of about 4.2 ppm/K when including silicon, and copper (Cu), aluminum (Al), silver (Ag), gold (Au), or the like that may constitute the portion of the electrode layer 424 adjacent to the adhesive layer 422 (e.g., in the embodiment of the invention, the electrode layer 424) has a coefficient of thermal expansion of approximately 14.2 ppm/K or more. More particularly, Cu has a coefficient of thermal expansion of about 16.5 ppm/K, Al has a coefficient of thermal expansion of about 23.0 ppm/K, Ag has a coefficient of thermal expansion of about 19.2 ppm/K, and Au has a coefficient of thermal expansion of about 14.2 ppm/K.

Considering this, a material (e.g., a metal) constituting the adhesive layer 422 may have a coefficient of thermal expansion of about 4.5 ppm/K to about 14 ppm/K. When the coefficient of thermal expansion of the material is less than 4.5 ppm/K or exceeds 14 ppm/K, a difference between the coefficients of thermal expansion of the adhesive layer 422 and the semiconductor layer is reduced and thus adhesion enhancement effects may be insufficient. Considering this, the adhesive layer 422 may include titanium (Ti) having a coefficient of thermal expansion of about 8.4 ppm/K or tungsten (W) having a coefficient of thermal expansion of about 4.6 ppm/K. For example, the adhesive layer 422 may be formed of Ti or W.

As such, when the adhesive layer 422 includes Ti or W, contact characteristics may be enhanced by reducing a difference between the coefficients of thermal expansion of the adhesive layer 422 and the semiconductor layer. In addition, Ti or W may act as a barrier of a material (e.g., Cu or the like) constituting the portion (e.g., in the embodiment of the invention, the electrode layer 424) of the electrode layer 424 adjacent to the adhesive layer 422 and thus may prevent the material from diffusing into the semiconductor layer or the semiconductor substrate 10. Accordingly, problems that may occur through diffusion of the material constituting the electrode layer 424 into the first and second conductive type regions 32 and 34 or the semiconductor substrate 10 may be prevented or reduced.

In this regard, the adhesive layer 422 according to the embodiment of the invention may have transparency, which allows light to pass therethrough. When the adhesive layer 422 has a small thickness even when including a metal, the adhesive layer 422 may have transparency. Thus, in the embodiment of the invention, the adhesive layer 422 may have light transmitting properties by restricting the thickness of the adhesive layer 420 to a certain level or less. When the adhesive layer 422 has transparency, light having passed through the adhesive layer 422 is directed back into the semiconductor substrate 10 by reflection from the electrode layer 424 formed on the adhesive layer 422 or a layer constituting a portion of the electrode layer 424. Due to reflection of light from the first electrode 42, the amount and residence time of light present in the semiconductor substrate 10 is increased and, accordingly, efficiency of the solar cell 150 may be enhanced.

The term "transparency" as used herein includes an instance in which light is completely (i.e., 100%) transmitted and an instance in which light is partially transmitted. That is, the adhesive layer 422 may be a metal transparent film or a metal semi-transparent film. For example, the adhesive layer 422 may have a transparency of 50% to 100%, more particularly 80% to 100%. When the transparency of the adhesive layer 422 is less than 50%, the amount of light reflected from the electrode layer 424 is insufficient and thus it may be difficult to sufficiently enhance the efficiency of the solar cell 150. When the transparency of the adhesive layer 422 is 80% or more, the amount of light reflected from the electrode layer 424 may be further increased and thus may further contribute to improvement in the efficiency of the solar cell 150.

For this operation, the adhesive layer 422 may have a smaller thickness than the electrode layer 424. In the embodiment of the invention, the electrode layer 420 is formed of one single layer; however, the embodiment of the invention is not limited thereto. Thus, the electrode layer 424 may include a plurality of layers. In this case, the adhesive layer 422 may have a smaller thickness than each of the layers. Thus, the adhesive layer 422 may be formed so as to have transparency.

In particular, the adhesive layer 422 may have a thickness of 50 nm or less. When the thickness of the adhesive layer 422 exceeds 50 nm, the transparency of the adhesive layer 422 is reduced and thus the amount of light directed to the electrode layer 424 may be insufficient. The transparency of the adhesive layer 422 may be further enhanced by forming the adhesive layer 422 to a thickness of 15 nm or less. In this regard, the thickness of the adhesive layer 422 may be between 5 nm and 50 nm (e.g., between 5 nm and 15 nm). When the thickness of the adhesive layer 422 is less than 5 nm, it may be difficult to uniformly form the adhesive layer 422 and adhesion enhancement effects obtained by the adhesive layer 422 may be insufficient. However, the embodiment of the invention is not limited to the above examples and the thickness and the like of the adhesive layer 422 may vary in consideration of materials, manufacturing conditions, and the like.

The electrode layer 424 formed on the adhesive layer 422 may be a single layer or may include a plurality of layers so as to enhance various characteristics and the like. In the embodiment of the invention, the electrode layer 424 may be a single layer between the adhesive layer 422 and the ribbon-connected layer 426 and being contact with the adhesive layer 422 and the ribbon-connected layer 426. The electrode layer 424 reduces resistance of the first electrode 42 and increases electrical conductivity, and acts as an electrically conductive layer where the current is substantially transferred. Also, the electrode layer 424 acts as a barrier that prevents a material constituting the ribbon-connected layer 426 from migrating to the semiconductor layer or the semiconductor substrate 10 and reflects light by a reflective material. That is, the electrode layer 424 may act as both a barrier layer and a reflective electrode layer. The electrode layer 424 may be formed of a metal having excellent reflection properties and may include, for example, Cu, Al, Ag, Au, or an alloy thereof.

The electrode layer 424 has a greater thickness than the adhesive layer 422 and may have a thickness of 50 nm to 400 nm. For example, the electrode layer 424 may have a thickness of 100 nm to 400 nm (more particularly, 100 nm to 300 nm). When the thickness of the electrode layer 424 is less than 50 nm, it may be difficult for the electrode layer 424 to act as a barrier layer and a reflective electrode layer. When the thickness of the electrode layer 424 exceeds 400 nm, reflection properties and the like are not significantly enhanced and manufacturing costs may be increased. When the thickness of the electrode layer 424 is 100 nm or more, resistance of the electrode layer 424 can be reduced. When the thickness of the electrode layer 424 is 300 nm or less, effect for reducing the resistance of the electrode layer 424 is sufficient and a peeling due to an increase of thermal stress can be effectively prevented. However, the embodiment of the invention is not limited thereto, and thus, the thickness of the electrode layer 424 may be varied.

Figure 4:
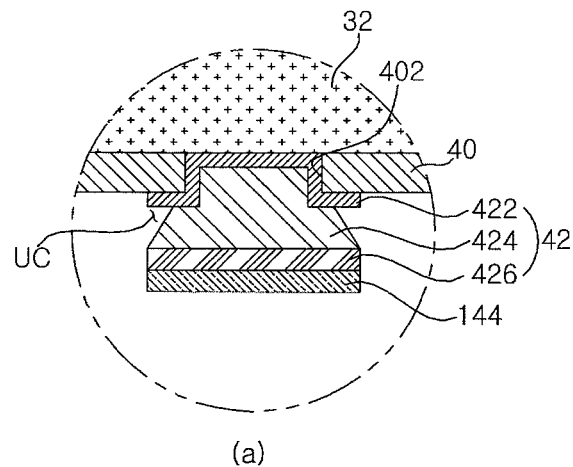
FIG. 4 illustrates schematic enlarged views illustrating various examples of an adhesion structure between a first electrode and a ribbon of a solar cell according to an embodiment of the invention.
Figure 4:
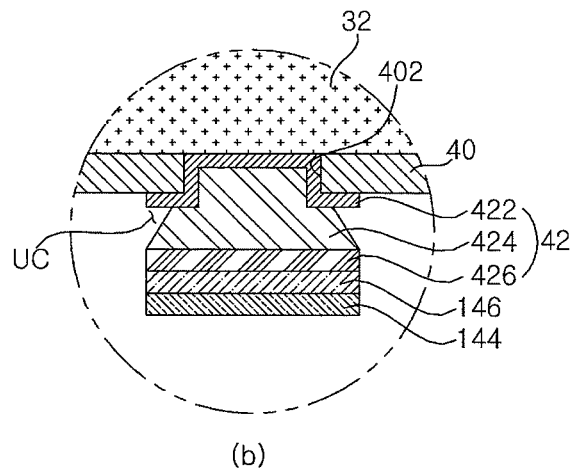
Figure 4:
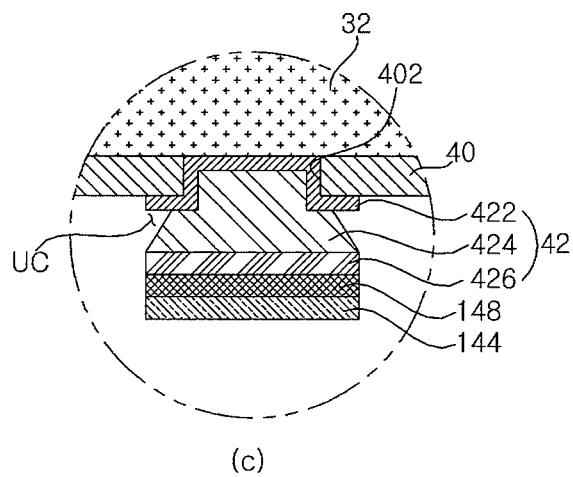

The ribbon-connected layer 426 may be formed on the electrode layer 424. For example, the ribbon-connected layer 426 may contact the electrode layer 424 thereon. The ribbon-connected layer 426 is a portion connected to the ribbon 144 and may include a material having excellent connection properties with the ribbon 144. Various examples of a connection structure between the ribbon-connected layer 426 and the ribbon 144 will be described with reference to FIG. 4. FIG. 4 illustrates enlarged views illustrating various examples of an adhesion structure between the first electrode 42 of the solar cell 150 and the ribbon 144. For clear and brief explanation, a shape of the first electrode 42 of FIG. 4 is illustrated based on the shape of the first electrode 42 illustrated in an enlarged circle of FIG. 2.

In an embodiment of the invention, as illustrated in (a) of FIG. 4, the ribbon 144 may be directly attached to the ribbon-connected layer 426 by disposing the ribbon 144 including, for example, lead (Pb) and tin (Sn) on the ribbon-connected layer 426 and applying heat thereto. In another embodiment of the invention, as illustrated in (b) of FIG. 4, the ribbon-connected layer 426 may be attached to the ribbon 144 via a paste layer 146 by applying heat in a state in which a paste (e.g., a paste including Sn, Bi, and the like) is disposed between the ribbon-connected layer 426 and the ribbon 144. In another embodiment of the invention, as illustrated in (c) of FIG. 4, the ribbon-connected layer 426 may be attached to the ribbon 144 via a conductive layer 148 by applying pressure in a state in which the conductive layer 148 is disposed between the ribbon-connected layer 426 and the ribbon 144. The conductive layer 148 may be prepared by dispersing conductive particles formed of Au, Ag, nickel (Ni), Cu, or the like, which are highly conductive, in a film formed of epoxy resin, acryl resin, polyimide resin, polycarbonate resin, or the like. When such a conductive layer is pressed while applying heat, conductive particles are exposed to outside of the film and the solar cell 150 and the ribbon 144 may be electrically connected by the exposed conductive particles. As such, when a solar cell module is manufactured by connecting plural solar cells 150 by a conductive layer, manufacturing temperature may be reduced and thus bending of the solar cell 150 may be prevented or reduced. The ribbon-connected layer 426 and the ribbon 144 may be attached and connected to each other by various other methods.

The ribbon-connected layer 426 may include Sn or a Nickel-Vanadium (Ni—V) alloy. Sn has excellent adhesion with the ribbon 144, a paste for connection with the ribbon 144, or the like. In addition, the Ni—V alloy has excellent adhesion with the ribbon 144 or a paste for connection with the ribbon 144. More particularly, in a paste including Sn and Bi, Sn of the paste has very high adhesion with Ni of the Ni—V alloy. In addition, a Ni—V alloy has a very high melting point of about 1000° C. or more and thus has a higher melting point than materials of the other layers constituting the electrode layer 424. Thus, the ribbon-connected layer 426 is not deformed during adhesion to the ribbon 144 or manufacturing of the solar cell 150 and may sufficiently act as a capping film to protect the other layers constituting the electrode layer 424.

The ribbon-connected layer 426 may have a thickness of a nanometer to several hundred nanometers, for example, 50 nm to 300 nm. When the thickness of the ribbon-connected layer 426 is less than 50 nm, the adhesion property with the ribbon 144 may be deteriorated. When the thickness of the ribbon-connected layer 426 exceeds 300 nm, manufacturing costs may be increased. However, the embodiment of the invention is not limited to the above examples, and thus, the thickness of the ribbon-connected layer 426 may be varied.

In the embodiment of the invention, the first electrode 42 having the adhesive layer 422, the electrode layer 424, and the ribbon-connected layer 425 may be formed by a sputtering method. First, metal layers (constituting the adhesive layer 422, the electrode layer 424, and the ribbon-connected layer 426, respectively) are entirely formed to fill the opening (or openings) 402 (the opening (or openings) 404 in the case of the second electrode 44) of the passivation layer 40 formed on the back surface of the semiconductor substrate 10. And then, the patterning of the metal layers are performed to form the first electrode 42 (and/or the second electrode 42) having the adhesive layer 422, the electrode layer 424, and the ribbon-connected layer 426. The pattering may be performed by various patterning methods, for example, by a method using a resist and an etching solution. The specific manufacturing method of the first electrode 42 and/or the second electrode 44 will be described in more detail with reference FIGS. 5a to 5h.

Materials of the metal layers are stacked in a thickness direction of the solar cell 150 by using the sputtering. Therefore, the adhesive layer 422 has a uniform thickness at an entire portion, the electrode layer 424 has a uniform thickness at an entire portion, and the ribbon-connected layer 426 has a uniform thickness at an entire portion. Here, the uniform thickness means a thickness that can be regarded as the same thickness considering the margin of error, for example, a thickness having a difference less than 10%.

Referring to FIG. 2 again, the first electrode 42 may have a width W2 smaller than a width W1 of the opening 402. Then, the first electrode 42 (a width of a broadest portion of the first electrode 42) has a large width, and the electrical resistance of the first electrode 42 can be reduced. For example, the opening 402 has the width W1 of about 10 um to about 50 um, the first electrode 42 has the width W2 of about 200 um to about 250 um. When the opening 402 has the width W1 less than 10 um, the connection property of the first electrode 42 and the first conductive type region 32 may be deteriorated. When the opening 402 has the width W1 larger than about 50 um, the first conductive type region 32 may be damaged during forming the opening 402. When the first electrode 42 has the width W2 is less than about 200 um, the first electrode 42 may not have the sufficient resistance. When the first electrode 42 has the width W2 larger than about 250 um, the first electrode 42 may be undesirably short-circuited to the adjacent second electrode 44. However, the embodiment of the invention is not limited thereto, and thus, the width W1 of the opening 402 and the width W2 of the first electrode 42 may have various values.

Therefore, the first electrode 42 (particularly, the adhesive layer 422) may be formed on a bottom surface of the opening 402 (that is, a contact surface with the semiconductor layer or the conductive type regions 32 and 34), on a side surface of the passivation layer 40 adjacent to the opening 402, and on the back surface of the passivation layer 40 adjacent to the opening 402. Particularly, the adhesive layer 422 may be in contact with a bottom surface of the opening 402 (that is, a contact surface with the semiconductor layer or the conductive type regions 32 and 34), with the side surfaces of the passivation layer 40 adjacent to the opening 402, and with the back surface of the passivation layer 40 adjacent to the opening 402. Since the first electrode 42 is formed on the side surfaces of the passivation layer 40 adjacent to the opening 402 and on the back surface of the passivation layer 40 as in the above, it can be seen that the electrodes 42 and 44 are formed by forming the metal layers for forming the electrodes 42 and 44 over the entire portion of the passivation layer 40 and pattering the metal layers.

Also, in the embodiment of the invention, at least a part of the side surfaces of the first electrode 42 (particularly, the side surfaces of a portion of the first electrode that is formed on the passivation layer 40) may have an undercut UC. The undercut UC is an over-etched region generated by anisotropic etching during a wet etching. More particularly, in the embodiment of the invention, the undercut UC may be formed at the side surfaces of the electrode layer 424 of the first electrode 42. Since the adhesive layer 422 and the ribbon-connected layer 426 have superior acid resistance, the undercut UC may be not formed or the undercut UC having a small width may be formed at the adhesive layer 422 and the ribbon-connected layer 426 have superior acid resistance. Meanwhile, because the electrode layer 424 has a relatively low acid resistance, the undercut UC may be easily formed at the electrode layer 424 by the etching solution. Thus, at least a part of the electrode layer 424 has a width W21 (a width of a narrowest portion of the first electrode 42) smaller than the width W2 of the first electrode 42 (for example, the width of the adhesive layer 422 or the ribbon-connected layer 426). In FIG. 2, it is exemplified that the width of the electrode layer 424 is the substantially same as the ribbon-connected layer 426 at a portion of the electrode layer 424 that is adjacent to the ribbon-connected layer 426, and gradually decreases toward the adhesive layer 422. However, the embodiment of the invention is not limited thereto, and thus, the shape or the width of the electrode layer 424 by the undercut UC may be varied.

For example, the undercut UC may have a width W22 (or a difference between the width W2 of the adhesive layer 422 or the ribbon-connected layer 426 and the width W1 of the electrode layer 424 at one side of the first electrode 42) of about 1 um to about 10 um. The undercut UC within the range may be generated by the wet etching. However, the embodiment of the invention is not limited thereto, and thus, the width W2 of the undercut UC may be varied.

It can be seen from the undercut UC that the electrodes 42 and 44 are formed by forming the metal layers for forming the electrodes 42 and 44 over the entire portion of the passivation layer 40 and pattering the metal layers.

The metal layer for forming the electrodes 42 and 44 are entirely formed by the sputtering as stated in the above, a physical damage of the passivation layer 40 may be possible due to the plasma used in order to improve the deposition velocity of the sputtering. Also, in the etching process for patterning the metal layers (for example, the wet etching process), the chemical damage of the passivation layer 40 may be possible. Accordingly, in the embodiment of the invention, the passivation layer 40 has high durability, and thus, the damage of the passivation layer 40 that may be generated during forming the electrodes 42 and 44 can be effectively prevented.

In the embodiment of the invention, the first electrode 42 may be formed without a plating process. In a case in which a portion of the first electrode 42 is formed by plating, when defects such as pin holes, scratch, or the like are present in the insulating layer 40, plating may be implemented even thereon and thus undesired portions may be plated. In addition, a plating solution used in a plating process is acidic or basic and thus may damage the passivation layer 40 or deteriorate characteristics of the passivation layer 40. In the embodiment of the invention, by not using a plating process, the characteristics of the insulating layer 40 may be enhanced and the first electrode 42 may be formed using simplified manufacturing processes. However, the embodiment of the invention is not limited thereto, and thus, the adhesive layer 422, the electrode layer 424, and the ribbon-connected layer 426 may be formed by various methods, and may be patterned by various patterning methods.

Hereafter, planar shapes of the first and second conductive type regions 32 and 34, the barrier region 36, and the first and second electrodes 42 and 44 will be described in detail with reference to FIG. 2.

Referring to FIG. 3, in the embodiment of the invention, the first and second conductive type regions 32 and 34 are formed long (or extending) so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W3 of the first conductive type region 32 may be greater than a width W4 of the second conductive type region 34. Thus, the area of the first conductive type regions 32 constituting an emitter region is sufficiently formed, which enables photoelectric conversion to occur in a wide region. In this regard, when the first conductive type regions 32 are of a p-type, the area of the first conductive type regions 32 is sufficiently secured and thus holes having a relatively slow movement rate may be effectively collected.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths (or areas) of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 2, an insulating layer or insulating layers (for example, the passivation layer 24 and/or the anti-reflective layer 26) may be disposed on the front surface of the semiconductor substrate 10 (more particularly, the front surface field region 130 formed at the front surface of the semiconductor substrate 10). According to embodiments of the invention, only the passivation layer 24 may be formed on the semiconductor substrate 10, only the anti-reflective layer 26 may be formed on the semiconductor substrate 10, or the passivation layer 24 and the anti-reflective layer 26 may be sequentially disposed on the semiconductor substrate 10. FIG. 2 illustrates an instance in which the passivation layer 24 and the anti-reflective layer 26 are sequentially formed on the semiconductor substrate 10 and the semiconductor substrate 10 contacts the passivation layer 24. However, the embodiment of the invention is not limited to the above examples, and the semiconductor substrate 10 may contact the anti-reflective layer 26. In addition, various modifications are possible.

The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed.

The passivation layer 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 150 may be increased. The anti-reflective layer 26 reduces reflectance of light incident upon the front surface of the semiconductor substrate 10. Thus, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 150 may be increased. As such, the open circuit voltage and the short-circuit current Isc of the solar cell 150 may be increased by the passivation layer 24 and the anti-reflective layer 26 and, accordingly, the efficiency of the solar cell 150 may be enhanced.

The passivation layer 24 and/or the anti-reflective layer 26 may be formed of various materials. For example, the passivation layer 24 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. For example, the passivation layer 24 may include silicon oxide, and the anti-reflective layer 26 may include silicon nitride. When the anti-reflective layer 26 includes the silicon nitride, the anti-reflective layer 26 has a refractive index smaller than that of the passivation layer 40 including the silicon nitride. As the refractive index of the anti-reflective layer 26 increases, the refraction of the light is easy, and thus, the light incident to an inside of the solar cell 150 may be hindered. Thus, the anti-reflective layer 26 has the relatively low refractive index in the embodiment of the invention. That is, the passivation layer 40 that the electrodes 42 and 44 are formed on and that includes the silicon nitride has relatively high refractive index, and thus, the damage during forming the electrodes 42 and 44 can be minimized. On the other hand, the anti-reflective layer 26 that is formed on a surface where the light is incident and the electrodes 42 and 44 are not formed and that includes the silicon nitride has relatively low refractive index, and thus, the anti-reflective layer 26 can be smoothly incident to the solar cell 150.

For example, when the anti-reflective layer 26 includes the silicon nitride, the anti-reflective layer 26 has the refractive index of about 2.0 or less (for example, about 1.8 to about 2.0). However, the embodiment of the invention is not limited thereto, and thus, the refractive index of the anti-reflective layer 26 may be varied. The anti-reflective layer 26 and the passivation layer 40 have the refractive index have the above ranges by controlling process conditions of the process forming the anti-reflective layer 26 and the passivation layer 40. For example, in a chemical vapor deposition CVD, as an amount of ammonia among feed gases for forming the silicon nitride increases, the refractive index of the silicon nitride layer can increase. The anti-reflective layer 26 and the passivation layer 40 can have the wanted refractive index by various methods.

When light is incident upon the solar cell 150 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44. Electric energy is generated thereby.

As in the embodiment of the invention, in the solar cell 150 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 may be minimized. Accordingly, efficiency of the solar cell 150 may be enhanced. However, the embodiment of the invention is not limited to the above examples. Thus, the structure of the electrodes 42 and 44 according to the embodiment of the invention may be applied to the solar cell 150 that the first electrode 42 is formed on the semiconductor substrate 10 (particularly, to the second electrode 44 of the solar cell 150 that is formed on the back surface of the semiconductor substrate 10).

In the embodiment of the invention, by limiting the material and the refractive index of the passivation layer 40 that is formed adjacent to the first and second electrode 42 and 44 in the solar cell 150 where both of the first and second electrodes 42 and 44 are formed on the back surface of the semiconductor substrate 10, the damage of the passivation layer 40, the conductive type regions 32 and 34, and so on that may be induced during forming the electrodes 42 and 44 can be effectively prevented. As a result, the properties and the efficiency of the solar cell 150 can be enhanced.

Hereinafter, the manufacturing method of the solar cell 100 having the above structure will be described in detail with reference to FIGS. 5a to 5j. FIGS. 5a to 5j are sectional views illustrating a method for manufacturing a solar cell according to an embodiment of the invention.

Figure 5A:
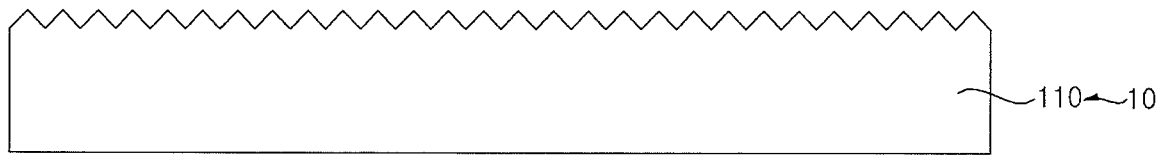
FIGS. 5a to 5j are sectional views illustrating a method for manufacturing a solar cell according to an embodiment of the invention.

First, as shown in FIG. 5a, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited there to, the base region 110 may have a p-type dopant.

At least one of the front and back surfaces of the semiconductor substrate 10 is textured so that the surface is an uneven surface (or have protruded portions and/or depressed portions). Wet or dry texturing method may be used as the texturing of the surface of the semiconductor substrate 10. Wet texturing may be carried out by dipping the semiconductor substrate 10 in a texturing solution and has an advantage of a short process time. Dry texturing is a process of cutting the surface of the semiconductor substrate 10 using a diamond drill, laser or the like and enables formation of uniform protruded portions and/or depressed portions, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions. Meanwhile, the back surface of the semiconductor substrate 10 may be a relatively smooth and even surface formed by mirror polishing or the like and having a lower surface roughness than the front surface of the semiconductor substrate 10. However, the embodiment of the invention is not limited thereto, and thus, the semiconductor substrate 10 having various structures may be used.

Figure 5B:
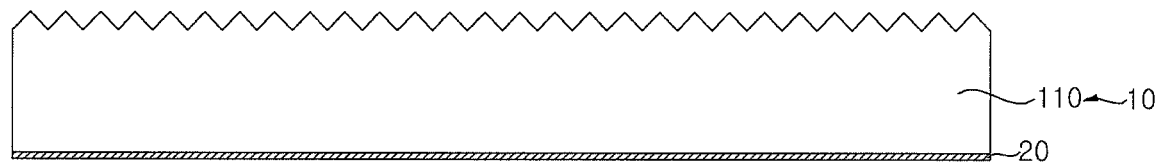

Then, as shown in FIG. 5b, a tunneling layer 20 is formed on the rear surface of the semiconductor substrate 10. The tunneling layer 20 may be formed over an entire portion of the semiconductor substrate 10.

In this instance, the tunneling layer 20 may be formed, for example, by a method such as thermal growth or deposition (for example, plasma-enhanced chemical vapor deposition chemical (PECVD), atomic layer deposition (ALD)) or the like, but the embodiment of the invention is not limited thereto and the tunneling layer 20 may be formed by a variety of methods.

Figure 5C:
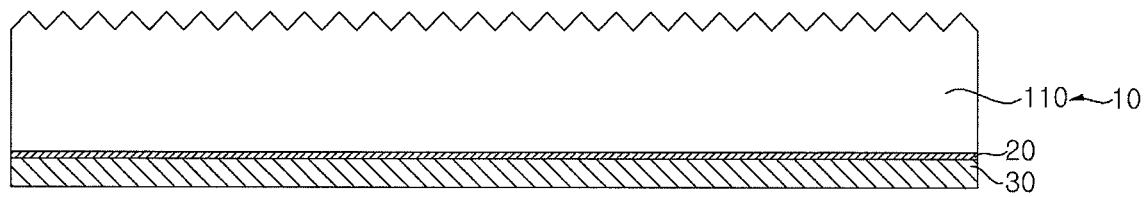
Figure 5D:
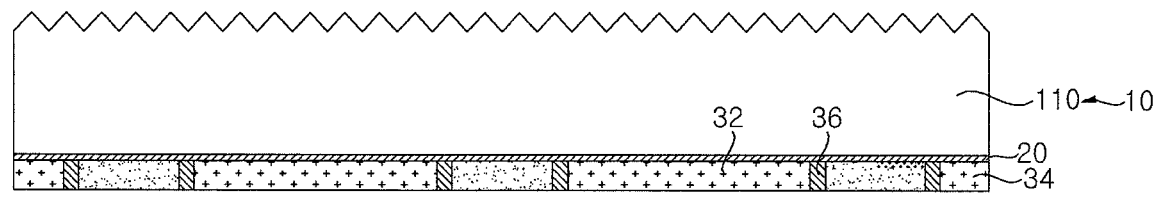

Then, as shown in FIGS. 5c and 5d, the first conductive type region 32 and the second conductive type region 34 are formed on the tunneling layer 20.

As shown in FIG. 5c, a semiconductor layer 30 is formed on the tunneling layer 20. The conductive type regions 32 and 34 may be formed of an amorphous, microcrystalline, or polycrystalline semiconductor. In this instance, the semiconductor layer 30 may be formed by a method, for example, thermal growth, deposition (for example, plasma-enhanced chemical vapor deposition chemical (PECVD)) or the like. However, the embodiment of the invention is not limited thereto, the semiconductor layer 30 may be formed by various methods.

Next, as shown in FIG. 5d, first conductive type regions 32, second conductive type regions 34, and barrier areas 36 are formed at the semiconductor layer 30.

For example, a region of the semiconductor layer 30 is doped with a first conductive type dopant to form the first conductive type region 32 by various methods such as an ion implantation method, a thermal diffusion method, or a laser doping method, and another region thereof is doped with a second conductive type dopant to form the second conductive type region 34 by various methods such as an ion implantation method, a thermal diffusion method, or a laser doping method. Then, the barrier region 36 may be formed in a region of the semiconductor layer 30 between the first and second conductive type regions 32 and 34.

However, the embodiment of the invention is not limited thereto. Various methods may be used for a method for forming the conductive type regions 32 and 34, and barrier region 36. Also, the barrier region 36 may be not formed. That is, various modifications are possible.

Figure 5E:
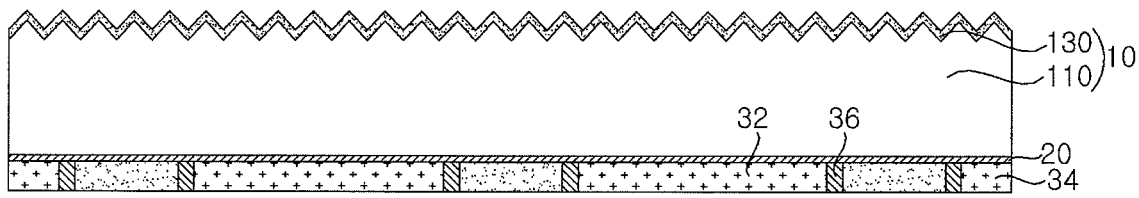

Next, as shown in FIG. 5e, a front surface field region 130 may be formed by doping the second conductive type dopant to the front surface of the semiconductor substrate 10. The front surface field region 130 may be formed by various methods, such as an ion implantation method, a thermal diffusion method, or a laser doping method.

Figure 5F:
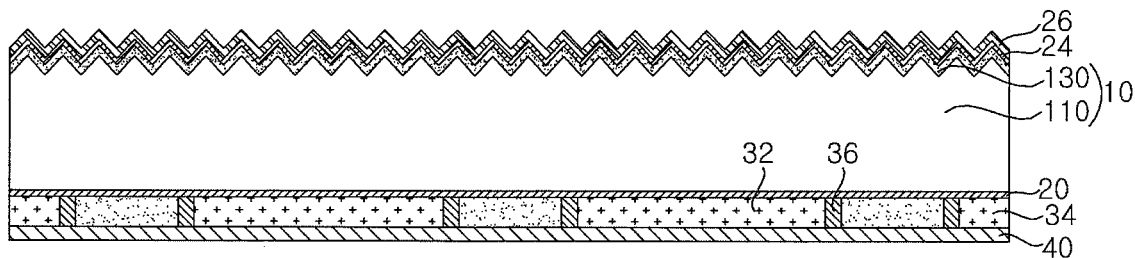

Next, as shown in FIG. 5f, a passivation layer 24 and an anti-reflective layer 26 are sequentially formed on the front surface of the semiconductor substrate 10, and a passivation layer 40 are sequentially formed on the rear surface of the semiconductor substrate 10. That is, the passivation layer 24 and the anti-reflective layer 26 are formed over the entire portion of the front surface of the semiconductor substrate 10, and the passivation layer 40 are formed over the entire portion of the rear surface of the semiconductor substrate 10. The passivation layer 24, the anti-reflective layer 26, and the passivation layer 40 may be formed by a variety of methods such as vacuum deposition, chemical vapor deposition, spin coating, screen printing or spray coating. A formation order of the passivation layer 24 and the anti-reflective layer 26, and the passivation layer 40 may be varied.

Figure 5G:
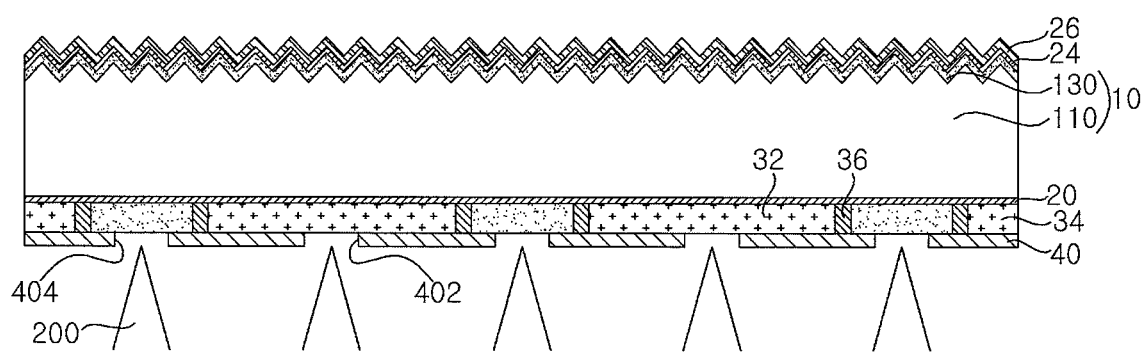

Next, as shown in FIG. 5g, first and second openings 402 and 404 are formed at the passivation layer 40, while remaining the protective layer 40a. The first and second openings 402 and 404 may be formed by various methods.

For example, in the embodiment of the invention, the first and second openings 402 and 404 may be formed by a laser ablation (a laser etching) using a laser 200. By using the laser ablation, widths of the first and second openings 402 and 404 can be reduced, and the first and second openings 402 and 404 having various patterns can be easily formed.

Figure 5H:
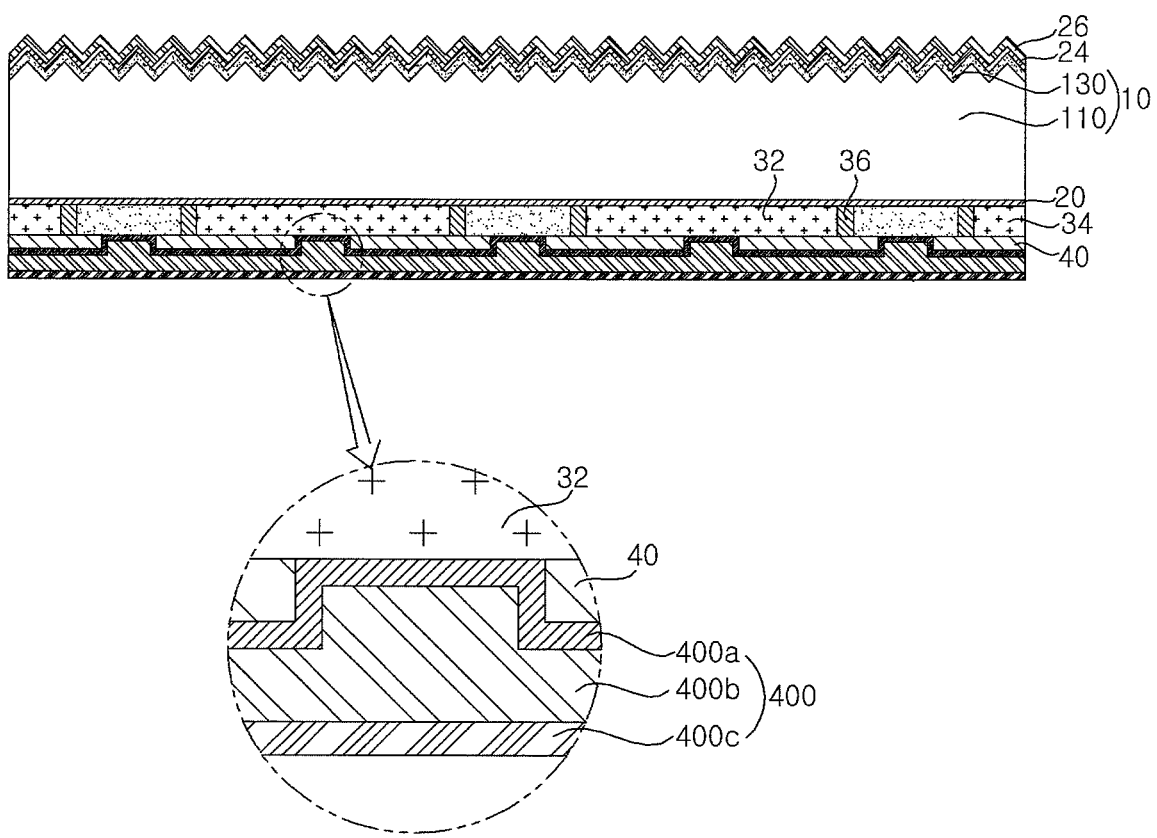

Next, as shown in FIG. 5h, the first and second electrodes 42 and 44 are formed to fill the first and second openings 402 and 404. A stacked structure and a manufacturing method of the first and second electrodes 42 and 44 were described with reference to FIG. 2, and the detailed descriptions are omitted.

Next, as shown in 5h, an electrode layer 400 is formed over the entire portion of the back surface of semiconductor substrate 10 (more particularly, over the entire portion of the semiconductor layer for forming the first and the second conductive type regions 32 and 34 to fill the openings 402 and 404. More particularly, an adhesive layer 400a, an electrode layer 400b, and a ribbon-connected layer 400c are sequentially formed by a sputtering. However, the embodiment of the invention is not limited thereto, and thus, the adhesive layer 400a, the electrode layer 400b, and the ribbon-connected layer 400c may be formed by various methods.

Figure 5I:
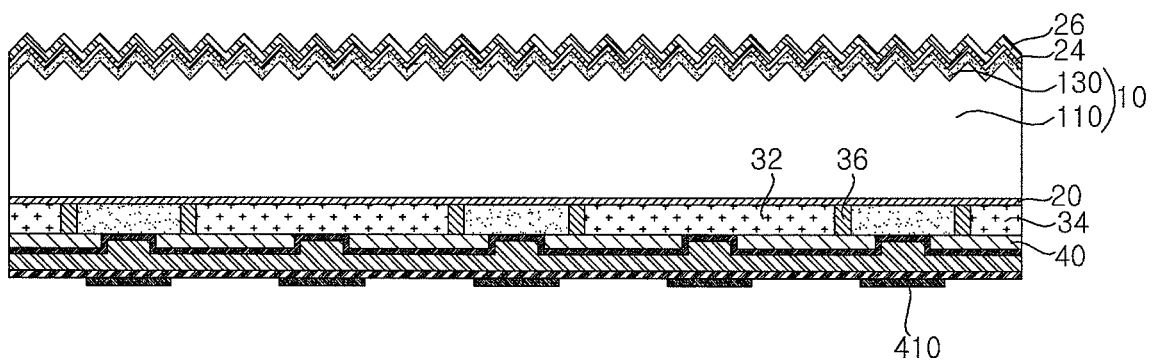

Next, as shown in FIG. 5i, a mask layer 410 is formed on the electrode layer 400. The mask layer 410 is formed to correspond to the electrodes 42 and 44, and prevents a portion corresponding to the electrodes 42 and 44 from being etched during an etching process. The mask layer 410 may be formed by a printing method, a photo lithography method, or so on. The mask layer 410 may have a width larger than a width of the openings 402 and 404.

Figure 5J:
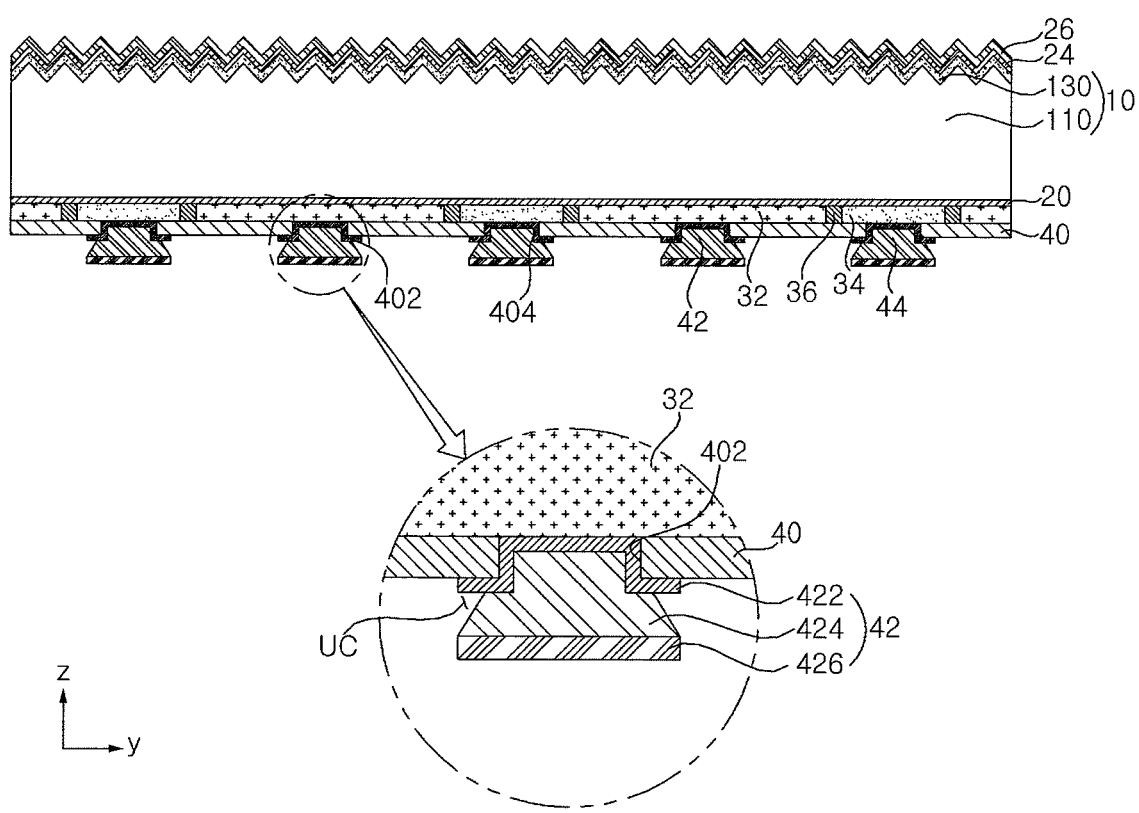

Next, as shown in FIG. 5j, the electrodes 42 and 44 are formed by eliminating the other portion of the electrode layer 400 where the mask layer 410 is not formed, and then, the mask layer 410 is eliminated. The other portion of the electrode layer 400 where the mask layer 410 is not formed may be eliminated by a wet etching process using an etching solution. An acid solution may be used for the etching solution, for example, a hydrofluoric acid, a phosphoric acid, a nitric acid, or a combination thereof. A patterning of the electrodes 42 and 44 are performed. By using the wet etching process as in the above, the patterning of the electrodes 42 and 44 can be performed by a simple process. However, the embodiment of the invention is not limited thereto.

In the embodiment of the invention, the electrodes 42 and 44 are formed by entirely forming the electrode layer 400 over the passivation layer 40 by the sputtering, and then, etching the electrode layer 40. Since the passivation layer 40 may be mechanically or chemically damaged during forming the electrodes 42 and 44, the passivation layer 40 may include the silicon nitride or the silicon carbide having enhanced durability, acid resistance, property for preventing metal diffusion, and plasma resistance in the embodiment of the invention. Thereby, the damage of the passivation layer 40 can be prevented, and the semiconductor substrate 10 and the conductive type regions 32 and 34 can be safely protected. As a result, the current density and the open circuit voltage of the solar cell 150 can be enhanced.

In the embodiment of the invention, it is exemplified that the tunneling layer 20, the conductive type regions 32 and 34, and the barrier region 35 are formed, and the front surface field layer 130 is formed, and then, the passivation layer 24, the anti-reflective layer 26, and the passivation layer 40 are formed, and finally the first and second electrodes 42 and 44 are formed. However, the embodiment of the invention is not limited thereto. Thus, a formation order of the tunneling layer 20, the second conductive type regions 32 and 34, the barrier region 36, the passivation layer 24, the anti-reflective layer 26, and the passivation layer 40 may be varied. In addition, some of them may be not included, and various modifications are possible.

Hereinafter, solar cells according to other embodiments of the invention and electrodes used for the solar cells will be described in detail. A detailed description of the same or almost the same elements as those in the foregoing description will be omitted herein and a detailed description of only different elements will be provided herein. The first electrode 42 will be described below with reference to the following drawings by way of example, but the following description may also be applied to the second electrode 44.

Figure 6:
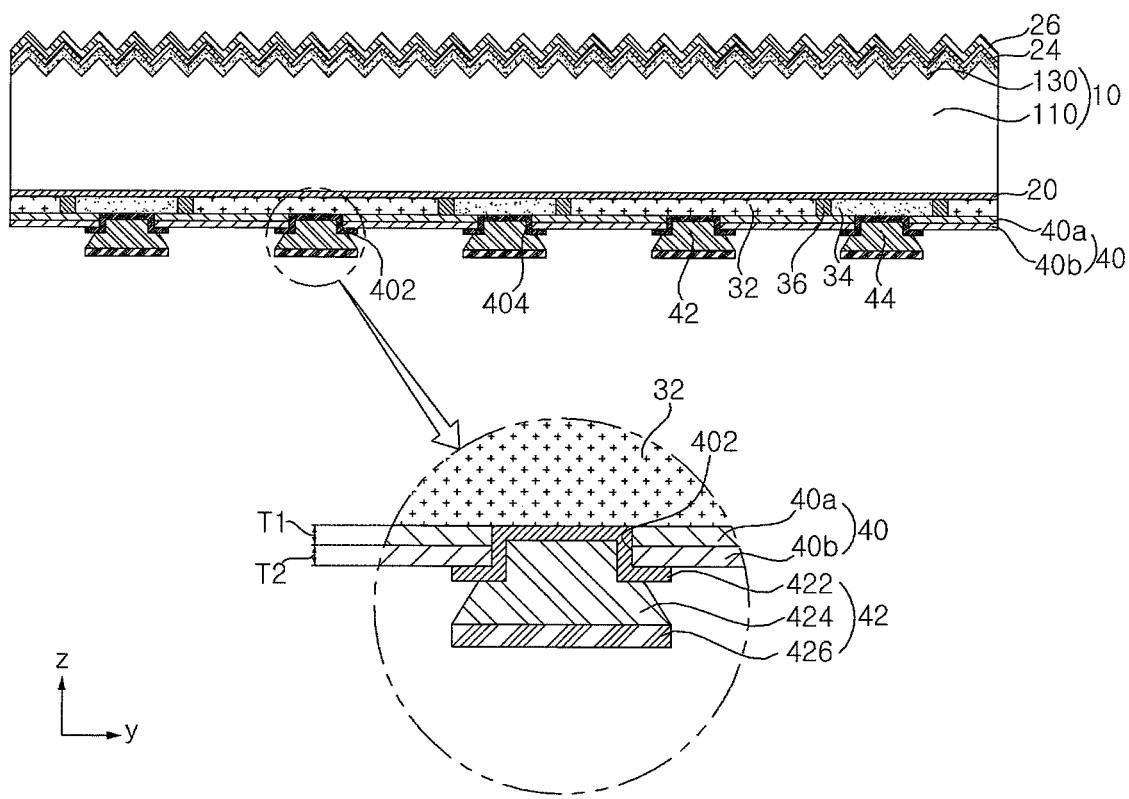
FIG. 6 is a sectional view of a solar cell according to another embodiment of the invention.

FIG. 6 is a sectional view of an electrode of a solar cell according to another embodiment of the invention.

Referring to FIG. 6, the passivation layer 40 according to the embodiment of the invention includes a first layer 40a and a second layer 40b. The first layer 40a is formed on (for example, is in a contact with) the conductive type regions 32 and 34 and includes the silicon nitride. The second layer 40b is formed on (for example, is in a contact with) the first layer 40a and includes the silicon carbide. The descriptions regarding silicon nitride layer used for the passivation layer 40 in the foregoing embodiment of the invention may be applied to the first layer 40a including the silicon nitride, and the descriptions regarding silicon carbide layer used for the passivation layer 40 in the foregoing embodiment of the invention may be applied to the second layer 40b including the silicon carbide. Thus, a detailed description thereof will be omitted herein.

According to the embodiment of the invention, the passivation layer 40 includes the first layer 40a and the second layer 40b having different materials, and thereby maximizing durability, acid resistance, property for preventing metal diffusion, and plasma resistance of the passivation layer 40. In this instance, since the second layer 40b including the silicon carbide is hydrophobic, the second layer 40b may be disposed to constitute the outer surface of the passivation layer 40 in order to increases a property related to the acid resistance.

In the embodiment of the invention, the first layer 40a has a thickness T1 is the same as or larger than a thickness T2 of the second layer 40b. As the first layer 40a having all of the durability, the acid resistance, the property for preventing metal diffusion, and the plasma resistance has a relatively large thickness, the superior properties of the first layer 40a can be achieved. Also, the second layer 40b has a relatively small thickness to have the hydrophobic property, and thus, a process time and cost for the second layer 40b can be reduced.

For example, a ratio (T2:T1) of the thickness T2 of the second layer 40b:the thickness T1 of the first layer 40a may be about 1:1 to about 1:4. When the ratio (T2:T1) is below about 1:1, the effect of the second layer 40*b* may be not sufficient. When the ratio (T2:T1) is above about 1:4, the process time and cost, and the thickness of the solar cell may increase due to the first layer 40*a*. Selectively, the thickness T1 of the first layer 40*a* is about 50 nm to about 200 nm, and the thickness T2 of the second layer 40*b* is about 10 nm to about 50 nm. When the thickness T1 of the first layer 40*a* is below about 50 nm or the thickness T2 of the second layer 40*b* is below about 10 nm, effects of the first or second layer 40*a* or 40*b* may be not sufficient. When the thickness T1 of the first layer 40*a* is above about 200 nm or the thickness T2 of the second layer 40*b* is above 50 nm, it may be difficult to reduce the process time and cost. However, the embodiment of the invention is not limited thereto, and thus, the thickness T1 of the first layer 40*a*, the thickness T2 of the second layer 40*b*, and the ratio (T2:T1) may be varied.

Figure 7:
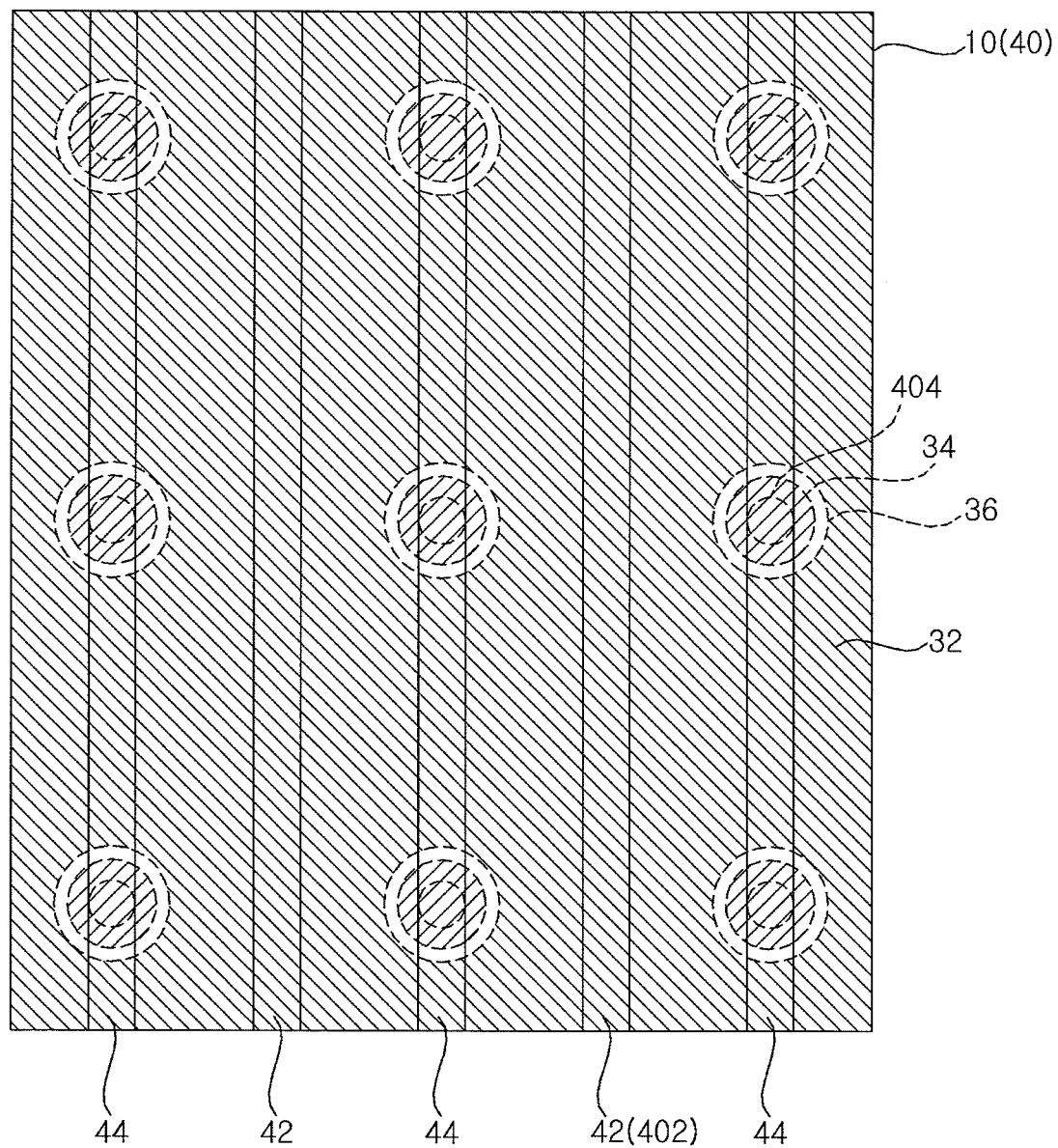
FIG. 7 is a partial rear plan view of the solar cell according to yet another embodiment of the invention.

FIG. 7 is a partial rear plan view of the solar cell according to still another embodiment of the invention.

Referring to FIG. 7, in the solar cell 150 according to the embodiment of the invention, plural second conductive type regions 34 may have an island shape and be spaced apart from each other, and the first conductive type region 32 may be entirely formed in a portion excluding the second conductive type regions 34 and the barrier region 36 surrounding each second conductive type region 34.

Due to such a configuration, the first conductive type region 32 has an area as wide as possible and thus photoelectric conversion efficiency may be enhanced. In addition, the second conductive type regions 34 may be disposed on the semiconductor substrate 10 with a large area while the first conductive type region 32 has a minimized area. Accordingly, surface recombination may be effectively prevented or reduced by the second conductive type regions 34 and the area of the second conductive type regions 34 may be maximized. However, the embodiment of the invention is not limited to the above examples, and the second conductive type regions 34 may have various shapes that enable the second conductive type regions 34 to have a minimized area.

Although FIG. 7 illustrates the second conductive type regions 34 as having a circular shape, the embodiment of the invention is not limited thereto. That is, the second conductive type regions 34 may also have a planar shape, for example, an oval shape or a polygonal shape such as a triangle, a tetragon, a hexagon, or the like.

The first and second openings 402 and 404 formed in the passivation layer 40 may have different shapes in consideration of shapes of the respective first and second conductive type regions 32 and 34. That is, the first opening 402 may extend long on the first conductive type region 32, and plural second openings 404 may be spaced apart from each other to correspond to the respective second conductive type regions 34. This is considering that the first electrode 42 is disposed only on the first conductive type region 32, and the second electrode 44 is disposed on the first and second conductive type regions 32 and 34. That is, the second openings 404 of the passivation layer 40 are formed to correspond to portions in which the second conductive type regions 34 are disposed, and the second electrode 44 and the second conductive type region 34 are connected by the second opening 404. In addition, the second openings 404 are not formed in portions of the insulating layer corresponding to the first conductive type regions 32 and thus the second electrodes 44 may insulate from the first conductive type regions 32. The first electrode 42 is formed only on each first conductive type region 32 and thus the first opening 402 may have the same or similar to that of the first electrode 42 and, accordingly, the first electrodes 42 may entirely contact the first conductive type regions 32 thereon. However, the embodiment of the invention is not limited to the above examples and various modifications are possible. For example, the first openings 402 may be formed as a plurality of contact holes having a similar shape to that of the second openings 404.

Figure 8:
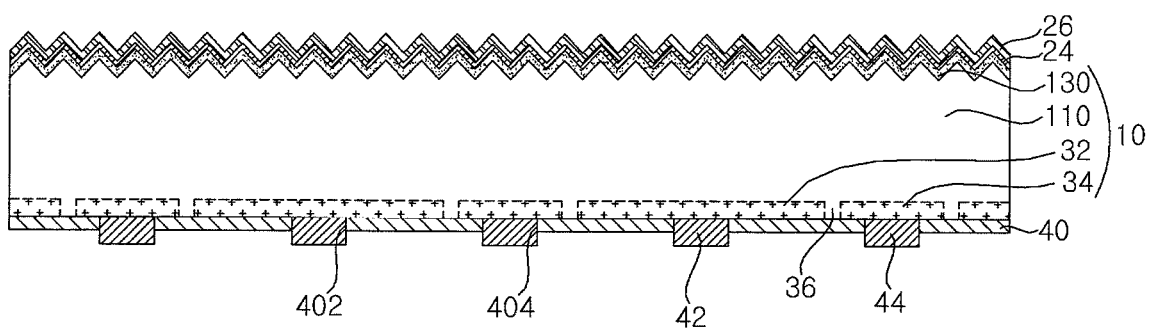
FIG. 8 is a sectional view of a solar cell according to still another embodiment of the invention.

FIG. 8 is a sectional view of a solar cell according to still another embodiment of the invention.

Referring to FIG. 8, in the solar cell 150 according to the embodiment of the invention, the tunneling layer (reference numeral of FIG. 2) is not formed, and the first and second conductive type regions 32 and 34 are formed as doping regions formed in the semiconductor substrate 10. That is, each of the first and second conductive type regions 32 and 34 is formed as a doping region formed by doping the semiconductor substrate 10 with a first or second conductive type dopant at a relatively high doping concentration. Accordingly, each of the first and second conductive type regions 32 and 34 constitutes the semiconductor substrate 10 by including a crystalline (single-crystalline or polycrystalline) semiconductor having a first or second conductive type. For example, each of the first and second conductive type regions 32 and 34 may be formed as a portion of a single-crystalline semiconductor substrate (e.g., a single-crystalline silicon wafer substrate) having a first or second conductive type.

In this embodiment of the invention, the adhesive layer (reference numeral 420 of FIG. 2) of the first electrode 42 contacts the semiconductor substrate 10 (or the first conductive type regions 32 constituting a portion of the semiconductor substrate 10), and an adhesive layer of the second electrode 44 contacts the semiconductor substrate 10 (or the second conductive type regions 34 constituting a portion of the semiconductor substrate 10). There is only a difference between the embodiment of the invention and the foregoing description in that the adhesive layer 422 of each of the first and second electrodes 42 and 44 contacts the semiconductor substrate 10 instead of contacting the semiconductor layer, and thus, a detailed description thereof will be omitted herein.

Particular characteristics, structures, or effects described in connection with the embodiment of the invention are included in at least one embodiment of the embodiments of the invention and not necessarily in all embodiments of the invention. Furthermore, the particular characteristics, structures, or effects of any specific embodiment of the embodiments of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiment of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments. In addition, it is to be understood that differences relevant to the variations and modifications fall within the spirit and scope of the embodiment of the invention defined in the appended claims.

What is claimed is:

1. A solar cell, comprising:
a semiconductor substrate including single-crystalline silicon;
a conductive type region comprising a first conductive type region and a second conductive type region formed on a back surface of the semiconductor substrate, the conductive type region including a polycrystalline silicon layer;
a first passivation layer comprising a silicon nitride layer formed on the conductive type region, and a silicon carbide layer formed on the silicon nitride layer;
an electrode comprising a first electrode and a second electrode, wherein the first electrode of a metal electrode being in contact with the polycrystalline silicon layer constituting the first conductive type region through a first opening penetrating the silicon nitride layer and the silicon carbide layer and the second electrode of a metal electrode being in contact with the polycrystalline silicon layer constituting the second conductive type region through a second opening penetrating the silicon nitride layer and the silicon carbide layer; and
an anti-reflection layer including silicon nitride on a front surface of the semiconductor substrate,
wherein a refractive index of the silicon nitride layer is larger than a refractive index of the anti-reflection layer.

2. The solar cell according to claim 1, wherein the refractive index of the silicon nitride layer is larger than a refractive index of the silicon carbide layer.

3. The solar cell according to claim 1, wherein the silicon nitride layer has a thickness that is the same as or larger than a thickness of the silicon carbide layer.

4. The solar cell according to claim 3, wherein a ratio of the thickness of the silicon carbide layer: the thickness of the silicon nitride layer is about 1:1 to about 1:4.

5. The solar cell according to claim 1, wherein the silicon nitride layer has a thickness of about 50 nm to about 200 nm.

6. The solar cell according to claim 1, wherein the silicon carbide layer has a thickness of about 10 nm to about 50 nm.

7. The solar cell according to claim 1, further comprising a second passivation layer between the semiconductor substrate and the anti-reflection layer.

8. The solar cell according to claim 1, wherein the silicon carbide layer has a refractive index of about 1.5 to about 2.0.

9. The solar cell according to claim 1, wherein at least one of the first electrode and the second electrode comprises a plurality of metal layers formed by sputtering.

10. The solar cell according to claim 1, further comprising a tunneling layer between the back surface of the semiconductor substrate and the conductive type region.

* * * * *